US010629643B2

(12) United States Patent
Kim et al.

(10) Patent No.: US 10,629,643 B2
(45) Date of Patent: Apr. 21, 2020

(54) INTEGRATED CIRCUIT DEVICES HAVING THROUGH-SILICON VIA STRUCTURES

(71) Applicant: Samsung Electronics Co., Ltd., Suwon-si, Gyeonggi-do (KR)

(72) Inventors: Sun-hyun Kim, Anyang-si (KR); Sang-il Jung, Seoul (KR); Byung-jun Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 378 days.

(21) Appl. No.: 15/227,509

(22) Filed: Aug. 3, 2016

(65) Prior Publication Data

US 2017/0040373 A1 Feb. 9, 2017

(30) Foreign Application Priority Data

Aug. 6, 2015 (KR) .................. 10-2015-0111211

(51) Int. Cl.
*H01L 27/146* (2006.01)
(52) U.S. Cl.
CPC .. *H01L 27/14636* (2013.01); *H01L 27/14621* (2013.01); *H01L 27/14627* (2013.01); *H01L 27/14634* (2013.01)
(58) Field of Classification Search
CPC .................. H01L 21/76898; H01L 23/481
See application file for complete search history.

(56) References Cited

U.S. PATENT DOCUMENTS

| 6,964,920 B2 | 11/2005 | Lee et al. | |
| 8,503,186 B2 | 8/2013 | Lin et al. | |
| 8,871,633 B2 | 10/2014 | Fukasawa | |
| 2008/0286962 A1 | 11/2008 | Lee | |
| 2010/0109164 A1* | 5/2010 | Kang | H01L 21/76898 257/774 |
| 2010/0140749 A1* | 6/2010 | Kuo | H01L 23/481 257/621 |
| 2011/0304026 A1* | 12/2011 | Tsui | H01L 21/76898 257/621 |

(Continued)

FOREIGN PATENT DOCUMENTS

| JP | 2000-091423 | 3/2000 |
| JP | 2002-299436 | 10/2002 |

(Continued)

*Primary Examiner* — Moazzam Hossain
*Assistant Examiner* — Hajar Kolahdouzan
(74) *Attorney, Agent, or Firm* — Myers Bigel, P.A.

(57) ABSTRACT

An integrated circuit (IC) device includes a first substrate and a first structure on a front surface of the first substrate. The first structure includes a first interlayer insulating layer structure including a plurality of first conductive pad layers spaced apart from one another at different levels of the first interlayer insulating layer structure. The IC device includes a second substrate on the first substrate and a second structure on a front surface of the second substrate, which faces the front surface of the first substrate. The second structure includes a second interlayer insulating layer structure bonded to the first interlayer insulating layer structure. A through-silicon via (TSV) structure penetrates the second substrate and the second interlayer insulating layer structure. The TSV structure is in contact with at least two first conductive pad layers of the plurality of first conductive pad layers located at different levels.

20 Claims, 23 Drawing Sheets

(56) References Cited

U.S. PATENT DOCUMENTS

| | | |
|---|---|---|
| 2012/0193809 A1 | 8/2012 | Chung |
| 2012/0267740 A1 | 10/2012 | Okamoto |
| 2013/0321680 A1* | 12/2013 | Kumano ............. H01L 27/1464 |
| | | 348/273 |
| 2015/0145144 A1 | 5/2015 | McDonald |

FOREIGN PATENT DOCUMENTS

| | | |
|---|---|---|
| KR | 10-1035597 | 5/2011 |
| KR | 1020150022987 | 3/2015 |

* cited by examiner

INTEGRATED CIRCUIT DEVICES HAVING THROUGH-SILICON VIA STRUCTURES

CROSS-REFERENCE TO RELATED APPLICATION

This U.S. non-provisional patent application claims benefit and priority under 35 U.S.C. § 119 to Korean Patent Application No. 10-2015-0111211, filed on Aug. 6, 2015, in the Korean Intellectual Property Office, the disclosure of which is incorporated herein in its entirety by reference.

BACKGROUND

The inventive concepts relate to integrated circuit (IC) devices, and more particularly, to IC devices including a through-silicon via (TSV) structure.

As the integration density and capacity of IC devices have increased, techniques of stacking discrete wafers have been developed. Among the techniques is a through-silicon via (TSV) technique of forming a hole through a silicon substrate and forming a through electrode in the trench.

SUMMARY

The inventive concepts provide an integrated circuit (IC) device, which may prevent or reduce degradation of electrical properties and/or maintain reliability in a TSV connection structure.

According to aspects of the inventive concepts, an IC includes a first substrate and a first structure on a front surface of the first substrate. The first structure includes a first interlayer insulating layer structure including a plurality of first conductive pad layers spaced apart from one another and located at different levels of the first interlayer insulating layer structure. The IC includes a second substrate on the first substrate and a second structure formed on a front surface of the second substrate, which faces the front surface of the first substrate. The second structure includes a second interlayer insulating layer structure bonded to the first interlayer insulating layer structure. A through-silicon via (TSV) structure is configured to penetrate the second substrate and the second interlayer insulating layer structure. The TSV structure is in contact with at least two first conductive pad layers of the plurality of first conductive pad layers located at different levels of the first interlayer insulating layer structure.

The second interlayer insulating layer structure may include a second conductive pad layer. The TSV structure may be in contact with the second conductive pad layer. The TSV structure may be in contact with a sidewall of at least one of the at least two first conductive pad layers in contact with the TSV structure and in contact with a sidewall of the second conductive pad layer.

An upper first conductive pad layer of the plurality of first conductive pad layers may include a through hole. The TSV structure may be in contact through the through hole with a lower first conductive pad layer located at a lower level than the upper first conductive pad layer including the through hole. The upper first conductive pad layer including the through hole may be an uppermost layer among the plurality of first conductive pad layers. The TSV structure may be in contact with at least a partial region of a surface of the upper first conductive pad layer including the through hole, which faces the front surface of the first substrate.

The TSV structure may include a first region located above the through hole, a second region located in the through hole, and a third region located below the through hole. A width of the second region in a first direction parallel to the front surface of the first substrate may be less than a width of the third region in the first direction. The TSV structure may have an inverted T shape in the second and third regions.

The plurality of first conductive pad layers may include an upper first conductive pad layer including a first through hole, a middle first conductive pad layer located at a lower level than the upper first conductive pad layer and including a second through hole, and a lower first conductive pad layer located at a lower level than the middle first conductive pad layer. The TSV structure may be in contact with the lower first conductive pad layer through the first and second through holes. A width of the first through hole in a first direction parallel to the front surface of the first substrate may be greater than a width of the second through hole in the first direction.

According to aspects of the inventive concepts, an IC device includes a first substrate including a first TSV area and a first pixel area. A first interlayer insulating layer structure is on a front surface of the first substrate. The first interlayer insulating layer structure includes a plurality of first conductive pad layers, which are formed in the first TSV area, spaced apart from one another, and located at different levels in the first interlayer insulating layer structure. A second substrate is on the first substrate and includes a second TSV area and a second pixel area. The second substrate includes a plurality of photodiodes in the second pixel area. A second interlayer insulating layer structure is on a front surface of the second substrate, which faces the front surface of the first substrate and is bonded to the first interlayer insulating layer structure. A TSV structure is configured to penetrate the second substrate and the second interlayer insulating layer structure. The TSV structure is in contact with at least two first conductive pad layers, which are located at different levels among the plurality of first conductive pad layers, in the first TSV area.

The first interlayer insulating layer structure may include a plurality of first interconnection layers formed in the first pixel area. The first interconnection layers may be spaced apart from one another and located at different levels in the first interlayer insulating layer structure. Respective ones of the plurality of first conductive pad layers in the first TSV area may be located at the same level as at least one of the first interconnection layers formed in the first pixel area.

At least one of the first conductive pad layers may have a reversed trapezoidal sectional shape. The TSV structure may have a staircase-shaped bottom surface.

The IC device may further include a plurality of color filters on a rear surface of the second substrate, which opposite the front surface of the second substrate, in the second pixel area, and microlenses formed on the plurality of color filters, respectively.

According to aspects of the inventive concepts, an IC device includes a first substrate, a first interlayer insulating layer structure on the first substrate, a second interlayer insulating layer structure directly on the first interlayer insulating layer structure, an upper first conductive pad layer within the first interlayer insulating layer structure, a lower first conductive pad layer within the first interlayer insulating layer structure, a second conductive pad layer within the second interlayer insulating layer structure, a second substrate on the second interlayer insulating layer structure, and a through-silicon via (TSV) structure including a conductive layer and configured to penetrate the second substrate, the second interlayer insulating layer structure, and the first interlayer insulating layer structure. The first interlayer insulating layer structure includes a first interlayer insulating layer, a first face, and a second face opposite the first face. The second interlayer insulating layer structure includes a second interlayer insulating layer, a third face directly in contact with the second face of the first interlayer insulating layer structure, and a fourth face opposite the third face. The upper first conductive pad layer is between the first face and the second face of the first interlayer insulating layer structure. The lower first conductive pad layer is between the upper first conductive pad layer and the first face of the first interlayer insulating layer structure. The second conductive pad layer is and between the third face and the fourth face of the second interlayer insulating layer structure. The TSV structure contacts the second conductive pad layer, the upper first conductive pad layer, and the lower first conductive pad layer.

A top surface of the upper first conductive pad layer may be between the second face and the first face, and a bottom surface of the upper first conductive pad layer may be between the top surface of the upper first conductive pad layer and the first face. A top surface of the lower first conductive pad layer may be between the bottom surface of the upper first conductive pad layer and the first face. A bottom surface of the lower first conductive pad layer may be between the top surface of the lower first conductive pad layer and the first face. A top surface of the second conductive pad layer may be between the third face and the fourth face. A bottom surface of the second conductive pad layer may be between the top surface of the second conductive pad layer and the third face. The TSV structure may contact the top surface of the upper first conductive pad layer, the top surface of the lower first conductive pad layer, and the top surface of the second conductive pad layer.

The TSV structure may extend through a hole in the upper first conductive pad layer to contact the top surface of the lower first conductive pad layer. The TSV structure may contact the bottom surface of the second conductive pad layer and the bottom surface of the upper first conductive pad layer.

The IC device may further include an additional first conductive pad layer within the first interlayer insulating layer structure between the upper first conductive pad layer and the second face. The hole in the upper first conductive pad layer is a first hole. The TSV structure may extend through a second hole in the additional first conductive pad layer to contact the top surface of the lower first conductive pad layer.

BRIEF DESCRIPTION OF THE DRAWINGS

Example embodiments of the inventive concepts will be more clearly understood from the following detailed description taken in conjunction with the accompanying drawings.

DETAILED DESCRIPTION OF THE EMBODIMENTS

Figure 1A:
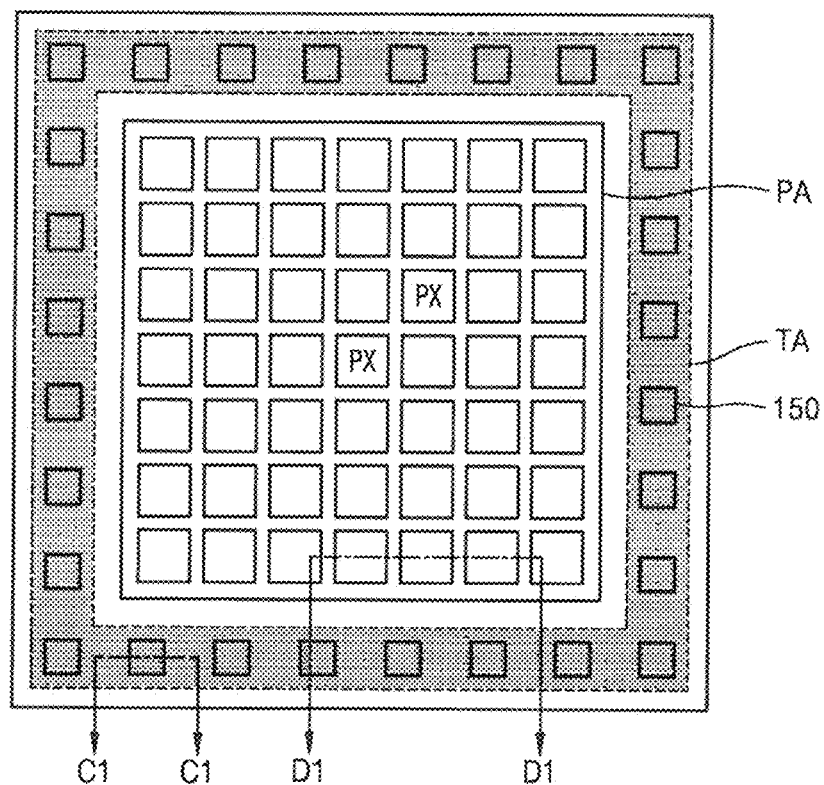
FIG. 1A is a plan view of an image sensor according to an example embodiment of the inventive concepts.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

As used herein, the term "and/or" includes any and all combinations of one or more of the associated listed items. Expressions such as "at least one of," when preceding a list of elements, modify the entire list of elements and do not modify the individual elements of the list.

The inventive concepts will now be described more fully hereinafter with reference to the accompanying drawings, in which example embodiments of the inventive concepts are shown. This inventive concepts may, however, be embodied in different forms and should not be construed as limited to the embodiments set forth herein. Rather, these embodiments are provided so that this disclosure is thorough and complete and fully conveys the scope of the inventive concepts to one skilled in the art. In the drawings, the thicknesses of layers and regions are exaggerated for clarity. Like reference numerals in the drawings denote like elements, and thus descriptions thereof will be omitted.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and this specification and will not be interpreted in an idealized or overly formal sense unless explicitly so defined herein.

When some embodiments may be embodied otherwise, respective process steps described herein may be performed otherwise. For example, two process steps described in a sequential order may be performed substantially the same time or in reverse order.

Variations from the shapes of the illustrations as a result, for example, of manufacturing techniques and/or tolerances, are to be expected. Thus, embodiments of the present inventive concepts should not be construed as limited to the particular shapes of regions illustrated herein but are to include deviations in shapes that result, for example, from manufacturing.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 1B:
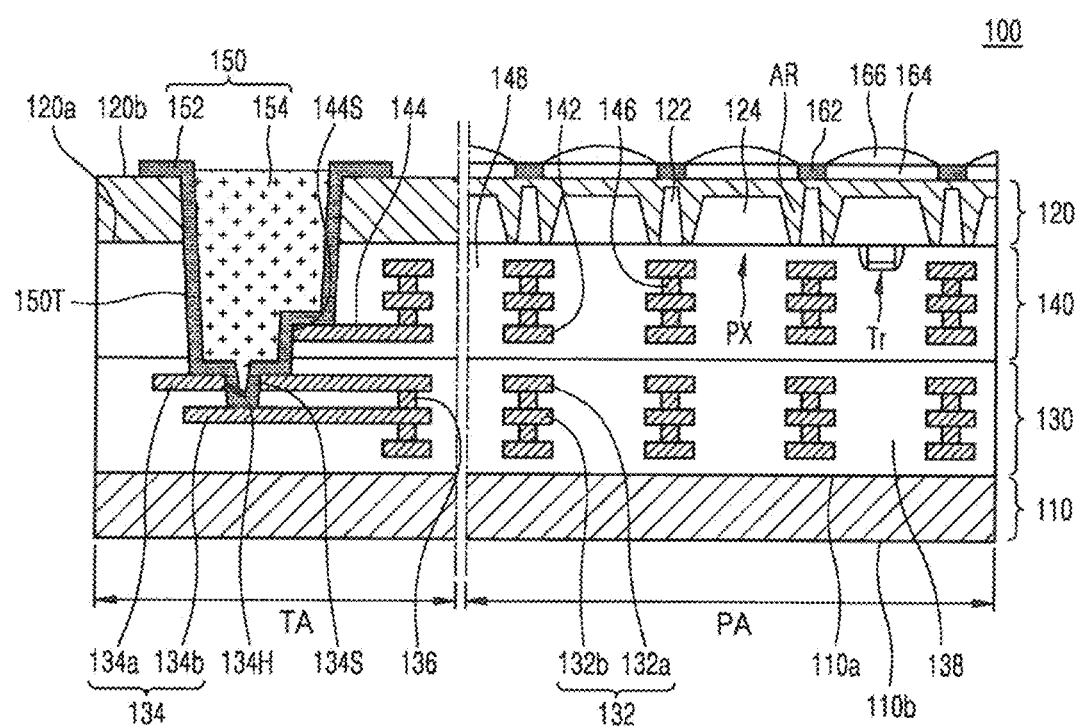
FIG. 1B is a cross-sectional view taken along lines C1-C1 and D1-D1 of FIG. 1A.
Figure 1C:
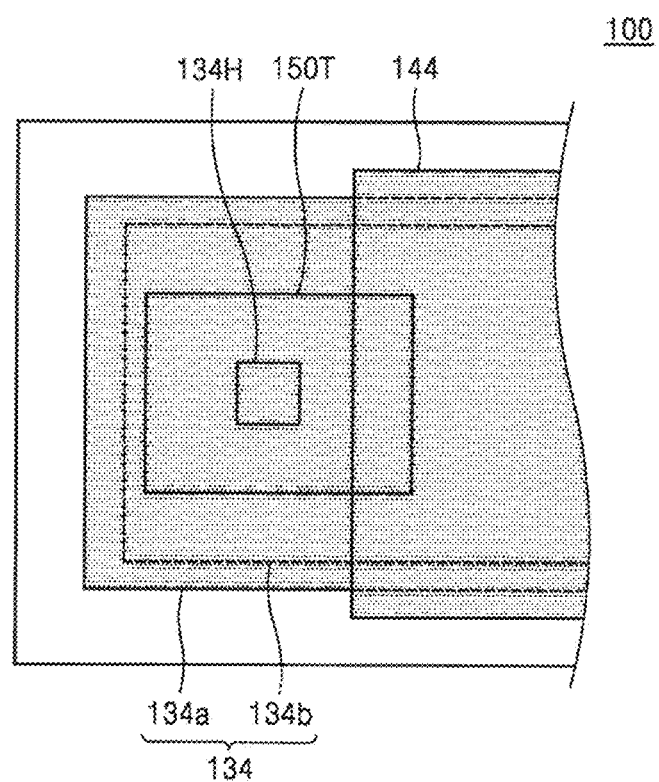
FIG. 1C is a plan view of a layout of first and second conductive pads of FIG. 1B.

FIG. 1A is a plan view of an image sensor 100 according to an example embodiment of the inventive concepts. FIG. 1B is a cross-sectional view taken along lines C1-C1 and D1-D1 of FIG. 1A. FIG. 1C is a plan view of a layout of first and second conductive pads 134 and 144 of FIG. 1B.

Specific shapes and layouts of the image sensor 100 and the first and second conductive pads 134 and 144 shown in FIGS. 1A and 1C are only examples and may be variously modified within the scope of the inventive concepts.

Referring to FIGS. 1A to 1C, the image sensor 100 may include a pixel area PA in which a plurality of unit pixels PX are disposed and a TSV area TA in which a plurality of TSV structures 150 are disposed. The TSV area TA may surround the pixel area PA.

The present embodiment illustrates a case in which the TSV area TA surrounds the pixel area PA, but a layout of the image sensor 100 in a plan view is not limited thereto.

The image sensor 100 may include first and second substrates 110 and 120, a first interlayer insulating layer structure 130 formed on a first surface 110a of the first substrate 110, and a second interlayer insulating layer structure 140 formed on a first surface 120a of the second substrate 120. The first interlayer insulating layer structure 130 and the second interlayer insulating layer structure 140 may be bonded to each other such that the first surfaces 110a and 120a of the first and second substrate 110 and 120 face one another.

The first substrate 110 may include the first surface 110a and a second surface 110b, and the second substrate 120 may include the first surface 120a and a second surface 120b. For example, the first surfaces 110a and 120a may correspond to front surfaces of the first and second substrates 110 and 120, and the second surfaces 110b and 120b may correspond to rear surfaces of the first and second substrates 110 and 120.

In some embodiments, the first and second substrates 110 and 120 may include silicon (Si), for example, crystalline silicon, polycrystalline silicon, or amorphous silicon. In some embodiments, the first and second substrates 110 and 120 may include a semiconductor (e.g., germanium (Ge)) or a compound semiconductor, such as silicon germanium (SiGe), silicon carbide (SiC), gallium arsenide (GaAs), indium arsenide (InAs), or indium phosphide (InP).

The first interlayer insulating layer structure 130 may be formed on the first surface 110a of the first substrate 110. The first interlayer insulating layer structure 130 may include first interconnection layers 132, which are formed in the pixel area PA, spaced apart from one another, and located at different levels in the first interlayer insulating layer structure 130, first conductive pad layers 134, which are formed in the TSV area TA, spaced apart from one another, and located at different levels in the first interlayer insulating layer structure 130, first contact plugs 136 configured to connect the first interconnection layers 132 and the first conductive pad layers 134 with one another, and a first interlayer insulating layer 138 configured to cover the first interconnection layers 132, the first conductive pad layers 134, and the first contact plugs 136.

A second interlayer insulating layer structure 140 may be formed on the first interlayer insulating layer structure 130. The second interlayer insulating layer structure 140 may be in contact with the first surface 120a of the second substrate 120. The second interlayer insulating layer structure 140 may include second interconnection layers 142, which are formed in the pixel area PA, spaced apart from one another, and located at different levels in the second interlayer insulating layer structure 140, a second conductive pad layer 144 formed in the TSV area TA, second contact plugs 146 configured to connect the second interconnection layers 142 with one another, and a second interlayer insulating layer 148 configured to cover the second interconnection layers 142, the second conductive pad layer 144, and the second contact plugs 146. Furthermore, at least one transistor Tr may be formed in the second interlayer insulating layer structure 140 in the pixel area PA. The transistor Tr may serve to transfer charges generated by a photodiode 124 of each of the unit pixels PX.

Each of the first and second interconnection layers 132 and 142, the first and second conductive pad layers 134 and 144 and the first and second contact plugs 136 and 146 may include copper (Cu), tungsten (W), tungsten nitride (WN), tantalum (Ta), titanium (Ti), tantalum nitride (TaN), titanium nitride (TiN), cobalt (Co), manganese (Mn), aluminum (Al), aluminum nitride (AlN), or a combination thereof, but the inventive concepts are not limited thereto.

In the pixel area PA, shapes, numbers, and arrangements of the interconnection layers 132 and 142 and the transistors Tr shown in FIG. 1B are only examples and may be variously modified within the scope of the inventive concepts. For example, the present embodiment illustrates an embodiment in which one transistor Tr is formed in the pixel area PA, but the inventive concepts are not limited thereto. In some embodiments, a plurality of transistors may be formed in the pixel area PA, and a plurality of transistors may be formed in the TSV area TA.

In the pixel area PA, a device isolation layer 122 may be formed on the first surface 120a of the second substrate 120. The device isolation layers 122 may be formed by using, for example, a shallow trench isolation (STI) process. Photodiodes 124 may be formed on the first surface 120a of the second substrate 120 in an active region AR defined by the device isolation layers 122. The photodiodes 124 may include, for example, a P-type epitaxial layer into which N-type ions are implanted.

In the pixel area PA, color filters 164 may be formed on the second surface 120b of the second substrate 120. The color filters 164 may overlap the unit pixels PX, respectively. The respective color filters 164 may be spaced apart from one another by node separation patterns 162. A micro lens 166 may be provided on each of the color filters 164. The micro lens 166 may guide incident light such that the incident light is efficiently incident to the photodiode 124 of the unit pixel PX.

In the TSV area TA, a TSV structure 150 may be formed to penetrate the second substrate 120 and the second interlayer insulating layer structure 140 and to penetrate a partial upper region of the first interlayer insulating layer structure 130. The TSV structure 150 may include a TSV conductive layer 152 conformally formed along a TSV trench 150T and a charged layer 154 filling the TSV trench 150T that remains after the TSV conductive layer 152 is formed. The TSV conductive layer 152 may include, for example, W, Al, or a combination thereof, and the charged layer 154 may include a carbon-based insulating material, but the inventive concepts are not limited thereto.

The TSV structure 150 according to the present embodiment may be in contact with a plurality of first conductive pad layers 134 formed in the first interlayer insulating layer structure 130 and the second conductive layer 144 formed in the second interlayer insulating layer structure 140. Specifically, the TSV structure 150 may be connected to each of upper and lower first conductive pad layers 134a and 134b, which are formed in the first interlayer insulating layer structure 130, spaced apart from one another, and located at different levels in the first interlayer insulating layer structure 130.

To this end, the upper first conductive pad layer 134a disposed at an uppermost level of the first conductive pad layers 134 may include at least one through hole 134H. That is, the TSV structure 150 may be in contact with the lower first conductive pad layer 134b via the through hole 134H, and the lower first conductive pad layer 134b may be located at a lower level than the upper first conductive pad layer 134a.

The through hole 134H shown in FIG. 1C may have a tetragonal shape in a plan view, but the inventive concepts are not limited thereto. The through hole 134H may have one of various shapes, such as, for example, a circular shape, an elliptical shape, and a polygonal shape, in a plan view.

In some embodiments, the TSV structure 150 may be in contact with a sidewall 144S of the second conductive pad layer 144. Also, the TSV structure 150 may be in contact with a sidewall 134S of the upper first conductive pad layer 134a exposed by the through hole 134H.

When the TSV structure 150 is in contact with the first conductive pad layers 134 that are formed apart from one another at different levels, the TSV structure 150 may be in contact with the sidewall 134S of the upper first conductive pad layer 134a and increase bonding areas between the TSV structure 150 and the first conductive pad layers 134. Thus, bonding resistances between the TSV structure 150 and the first conductive pad layers 134 may be reduced.

Furthermore, the TSV structure 150 may be cubically bonded to the first conductive pad layers 134 formed apart from one another at different levels in the first interlayer insulating layer structure 130 as described above. Thus, contact failures, which may occur between the TSV structure 150 and the first conductive pad layers 134 due to a difference in coefficient of thermal expansion between hetero materials or physical impact during a subsequent annealing process, may be alleviated.

In some embodiments, the first conductive pad layers 134 that are in contact with the TSV structure 150 may be located at the same level in the first interlayer insulating layer structure 130 as at least some of the first interconnection layers 132 located in the pixel area PA. For example, the upper first conductive pad layer 134a may be located at the same level in the first interlayer insulating layer structure 130 as the first interconnection layer 132a, and the lower first conductive pad layer 134b may be located at the same level in the first interlayer insulating layer structure 130 as the first interconnection layer 132b.

Figure 2A:
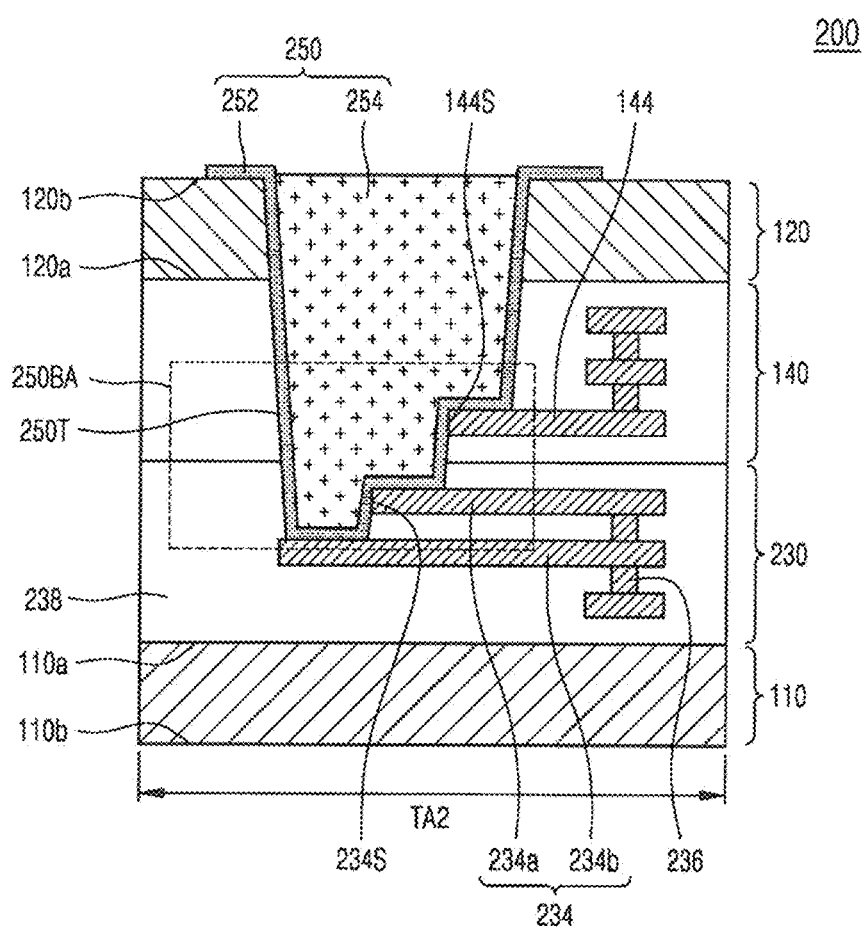
FIG. 2A is a cross-sectional view of a through-silicon via (TSV) area of an image sensor according to an example embodiment of the inventive concepts.
Figure 2B:
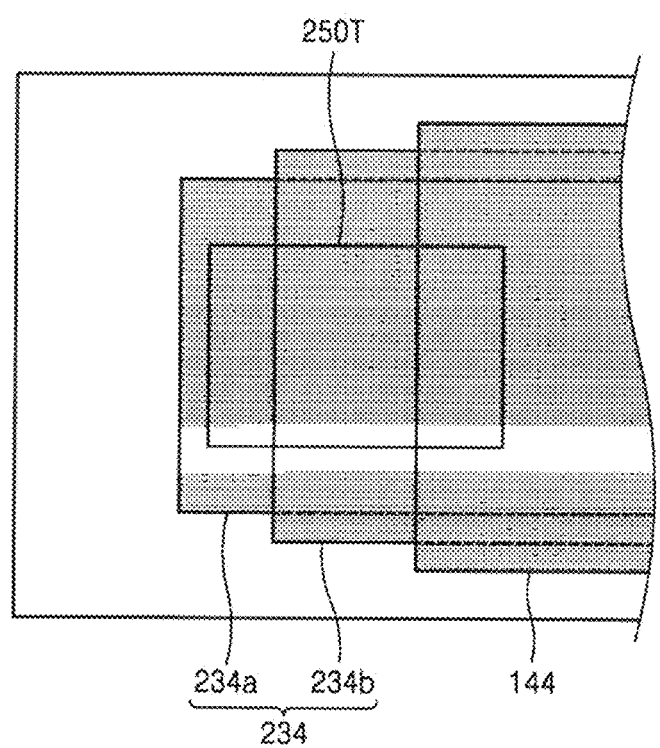
FIG. 2B is a plan view of a layout of first and second conductive pads of FIG. 2A.

FIG. 2A is a cross-sectional view of a TSV area TA2 of an image sensor 200 according to an example embodiment of the inventive concepts. FIG. 2B is a plan view of a layout of first and second conductive pads 234 and 144 of FIG. 2A.

In FIGS. 2A and 2B, the same reference numerals are used to denote the same elements as in FIGS. 1A to 1C, and repeated descriptions thereof are omitted for brevity.

Referring to FIGS. 2A and 2B, in the TSV area TA2, the image sensor 200 may include first and second substrates 110 and 120, a first interlayer insulating layer structure 230, and a second interlayer insulating layer structure 140. The first interlayer insulating layer structure 230 and the second interlayer insulating layer structure 140 may be bonded to each other such that first surfaces 110a and 120a of the first and second substrates 110 and 120 face one another. Also, the image sensor 200 may include a TSV structure 250 configured to penetrate the second substrate 120 and the second interlayer insulating layer structure 140.

The image sensor 200 may have a similar structure to the image sensor 100 described with reference to FIGS. 1A to 1C except for structures of first conductive pad layers 234 of the first interlayer insulating layer structure 230 and a structure of the TSV structure 250.

The first interlayer insulating layer structure 230 may include first conductive pad layers 234, first contact plugs 236, and a first interlayer insulating layer 238.

The TSV structure 250 may include a TSV conductive layer 252 and a charged layer 254. The TSV conductive layer 252 and the charged layer 254 may include substantially the same materials as the TSV conductive layer 152 and the charged layer 154, respectively, which are described with reference to FIGS. 1A and 1B.

The TSV structure 250 according to the present embodiment may be in contact with a plurality of first conductive pad layers 234 of the first interlayer insulating layer structure 230 and the second conductive pad layer 144 of the second interlayer insulating layer structure 140. Specifically, the TSV structure 250 may be connected to each of upper and lower first conductive pad layers 234a and 234b, which are formed in the first interlayer insulating layer structure 230, spaced apart from one another, and located at different levels in the first interlayer insulating layer structure 230.

To this end, the second conductive pad layer 144, the upper first conductive pad layer 234a located at an uppermost level of the first conductive pad layers 234, and the lower first conductive pad layer 234b located at a lower level than the upper first conductive pad layer 234a may be disposed as a staircase structure in a region that contacts the TSV structure 250. That is, a bottom area 250BA of the TSV structure 250 may have a staircase shape. Thus, the TSV structure 250 may sequentially contact the conductive pad layers 144, 234a, and 234b.

In some embodiments, the TSV structure 250 may be in contact with a sidewall 144S of the second conductive pad layer 144 and a sidewall 234S of the upper first conductive pad layer 234a.

When the TSV structure 250 is in contact with each of the first conductive pad layers 234 formed apart from one another at different levels, bonding areas between the TSV structure 250 and the first conductive pad layers 234 may increase. Thus, bonding resistances between the TSV structure 250 and the first conductive pad layers 234 may be reduced.

Figure 3A:
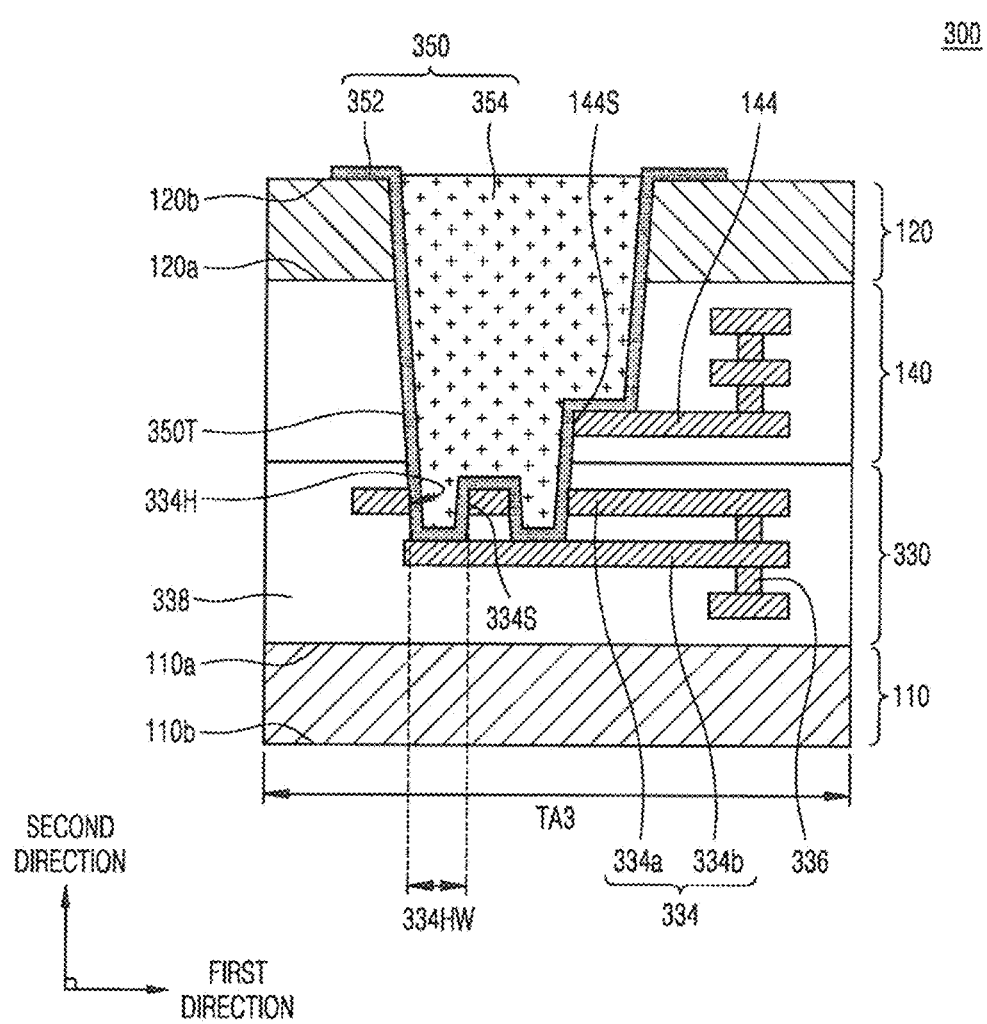
FIG. 3A is a cross-sectional view of a TSV area of an image sensor according to an example embodiment of the inventive concepts.
Figure 3B:
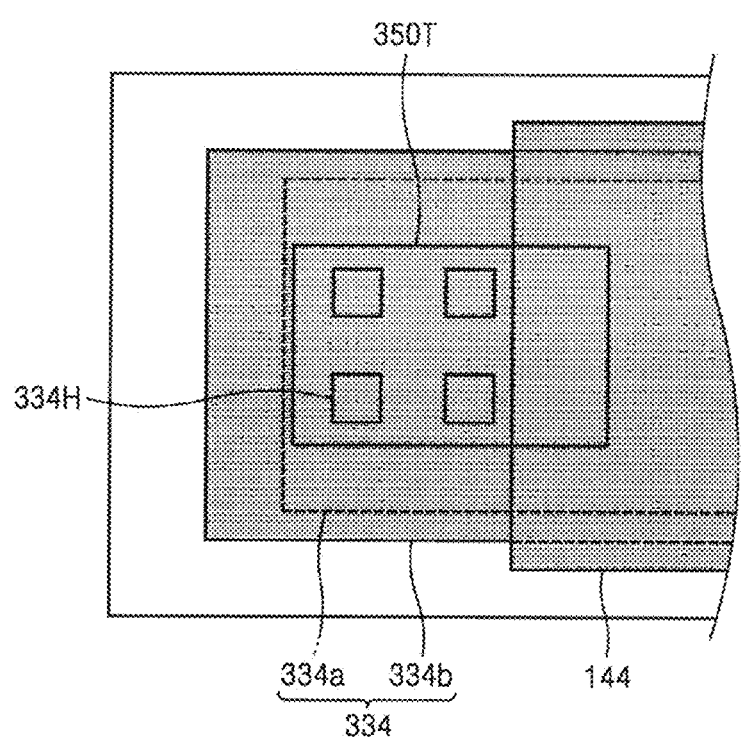
FIG. 3B is a plan view of a layout of first and second conductive pads of FIG. 3A.

FIG. 3A is a cross-sectional view of a TSV area TA3 of an image sensor 300 according to an example embodiment of the inventive concepts. FIG. 3B is a plan view of a layout of first and second conductive pads 334 and 144 of FIG. 3A.

In FIGS. 3A and 3B, the same reference numerals are used to denote the same elements as in FIGS. 1A to 1C, and repeated descriptions thereof are omitted for brevity.

Referring to FIGS. 3A and 3B, in a TSV area TA3, the image sensor 300 may include first and second substrates 110 and 120, a first interlayer insulating layer structure 330, and a second interlayer insulating layer structure 140. The first interlayer insulating layer structure 330 and the second interlayer insulating layer structure 140 may be bonded to each other such that first surfaces 110a and 120a of the first and second substrates 110 and 120 face each other. Also, the image sensor 300 may include a TSV structure 350 configured to penetrate the second substrate 120 and the second interlayer insulating layer structure 140.

The image sensor 300 may have a similar structure to the image sensor 100 described with reference to FIGS. 1A to 1C except for structures of first conductive pad layers 334 of the first interlayer insulating layer structure 330 and a structure of the TSV structure 350.

The first interlayer insulating layer structure 330 may include first conductive pad layers 334, first contact plugs 336, and a first interlayer insulating layer 338.

The TSV structure 350 may include a TSV conductive layer 352 and a charged layer 354. The TSV conductive layer 352 and the charged layer 354 may include substantially the same materials as the TSV conductive layer 152 and the charged layer 154, respectively, which are described with reference to FIGS. 1A and 1B.

The TSV structure 350 may be in contact with a plurality of first conductive pad layers 334 of the first interlayer insulating layer structure 330 and the second conductive layer 144 of the second interlayer insulating layer structure 140. Specifically, the TSV structure 350 may be connected to each of upper and lower first conductive pad layers 334a and 334b formed in the first interlayer insulating layer structure 330 apart from one another at different levels in the first interlayer insulating layer structure 330.

To this end, the upper first conductive pad layer 334a disposed at an uppermost level of the first conductive pad layers 334 may include a plurality of through holes 334H. That is, the TSV structure 350 may be in contact with the lower first conductive pad layer 334b via the through holes 334H in the upper first conductive pad layer 334a, and the lower first conductive pad layer 334b may be located at a lower level than the upper first conductive pad layer 334a.

In some embodiments, a width 334HW of each of the through holes 334H in a first direction parallel to the first surface 110a of the first substrate 110 may range from about 0.5 µm to about 1.5 µm. The through hole 334H may have one of various shapes, such as, for example, a circular shape, an elliptical shape, and a polygonal shape, in a plan view, but the inventive concepts are not limited thereto.

In some embodiments, the TSV structure 350 may be in contact with a sidewall 144S of the second conductive pad layer 144 and sidewalls 334S of the upper first conductive pad layers 334a exposed by the through holes 334H.

When the upper first conductive pad layer 334a includes a plurality of through holes 334H as described above, bonding areas between the TSV structure 350 and the first conductive pad layers 334 may further increase. Thus, bonding resistances between the TSV structure 350 and the first conductive pad layers 334 may be reduced.

Furthermore, since the TSV structure 350 may be cubically bonded to the first conductive pad layers 334 formed apart from one another at different levels as described above, contact failures, which may occur between the TSV structure 350 and the first conductive pad layers 334, may be alleviated.

Figure 4:
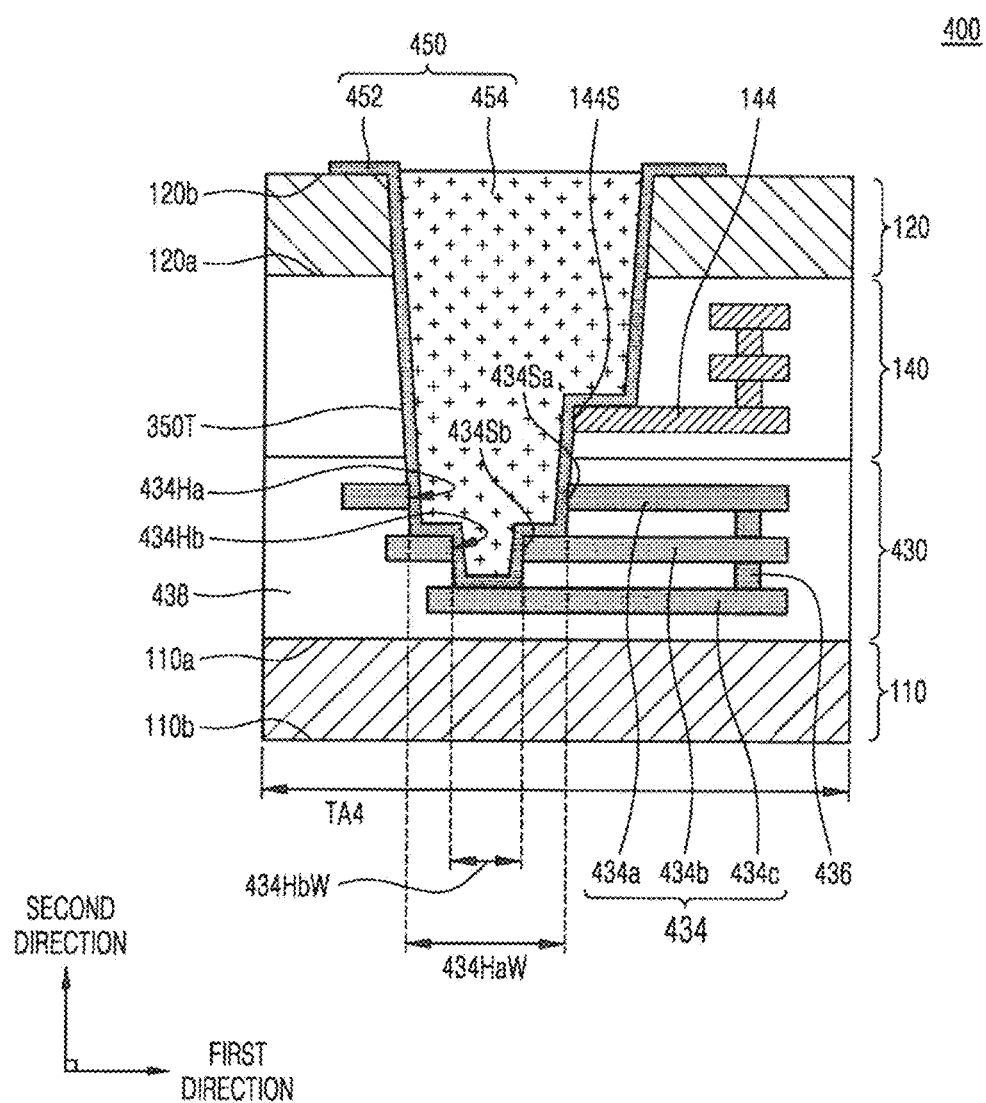
FIG. 4 is a cross-sectional view of a TSV area of an image sensor according to an example embodiment of the inventive concepts.

FIG. 4 is a cross-sectional view of a TSV area TA4 of an image sensor 400 according to an example embodiment of the inventive concepts.

In FIG. 4, the same reference numerals are used to denote the same elements as in FIGS. 1A to 1C, and repeated descriptions thereof are omitted for brevity.

Referring to FIG. 4, in the TSV area TA4, the image sensor 400 may include first and second substrates 110 and 120, a first interlayer insulating layer structure 430, and a second interlayer insulating layer structure 140. The first interlayer insulating layer structure 430 and the second interlayer insulating layer structure 140 may be bonded to each other such that first surfaces 110a and 120a of the first and second substrates 110 and 120 face each other. Also, the image sensor 400 may include a TSV structure 450 configured to penetrate the second substrate 120 and the second interlayer insulating layer structure 140.

The image sensor 400 may have a similar structure to the image sensor 100 described with reference to FIGS. 1A to 1C except for structures of first conductive pad layers 434 of the first interlayer insulating layer structure 430 and a structure of the TSV structure 450.

The first interlayer insulating layer structure 430 may include first conductive pad layers 434, first contact plugs 436, and a first interlayer insulating layer 438.

The TSV structure 450 may include a TSV conductive layer 452 and a charged layer 454. The TSV conductive layer 452 and the charged layer 454 may include substantially the same materials as the TSV conductive layer 152 and the charged layer 154, respectively, which are described with reference to FIGS. 1A and 1B.

The TSV structure 450 according to the present embodiment may be in contact with a plurality of first conductive pad layers 434 of the first interlayer insulating layer structure 430 and the second conductive pad layer 144 of the second interlayer insulating layer structure 140. Specifically, the TSV structure 450 may be connected to each of upper, middle, and lower first conductive pad layers 434a, 434b, and 434c formed in the first interlayer insulating layer structure 430 apart from one another at different levels in the first interlayer insulating layer structure 430.

To this end, the upper first conductive pad layer 434a located at an uppermost level of the first conductive pad layers 434 may include a first through hole 434Ha, and the middle first conductive pad layer 434b located at a lower level than the upper first conductive pad layer 434a may include a second through hole 434Hb. That is, the TSV structure 450 may sequentially contact the first conductive pad layers 434a, 434b, and 434c via the through holes 434Ha and 434Hb.

In some embodiments, a width 434HaW of the first through hole 434Ha in a first direction parallel to the first surface 110a of the first substrate 110 may be greater than a width 434HbW of the second through hole 434Hb. In an example, the width 434HbW of the second through hole 434Hb may range from about 0.5 μm to about 1.5 μm, and the width 434HaW of the first through hole 434Ha may be about twice the width 434HbW of the second through hole 434Hb, but the inventive concepts are not limited thereto.

In some embodiments, the TSV structure 450 may be in contact with a sidewall 144S of the second conductive pad layer 144, a sidewall 434Sa of the upper first conductive pad layer 434a exposed by the first through hole 434Ha, and a sidewall 434Sb of the middle first conductive pad layer 434b exposed by the second through hole 434Hb.

When the upper first conductive pad layer 434a includes a plurality of through holes 434Ha and 434Hb as described above, bonding areas between the TSV structure 450 and the first conductive pad layers 434 may further increase. Thus, bonding resistances between the TSV structure 450 and the first conductive pad layers 434 may be reduced.

Furthermore, since the TSV structure 450 may be cubically bonded to the first conductive pad layers 434 formed apart from one another at different levels as described above, contact failures, which may occur between the TSV structure 450 and the first conductive pad layers 434, may be alleviated.

Figure 5:
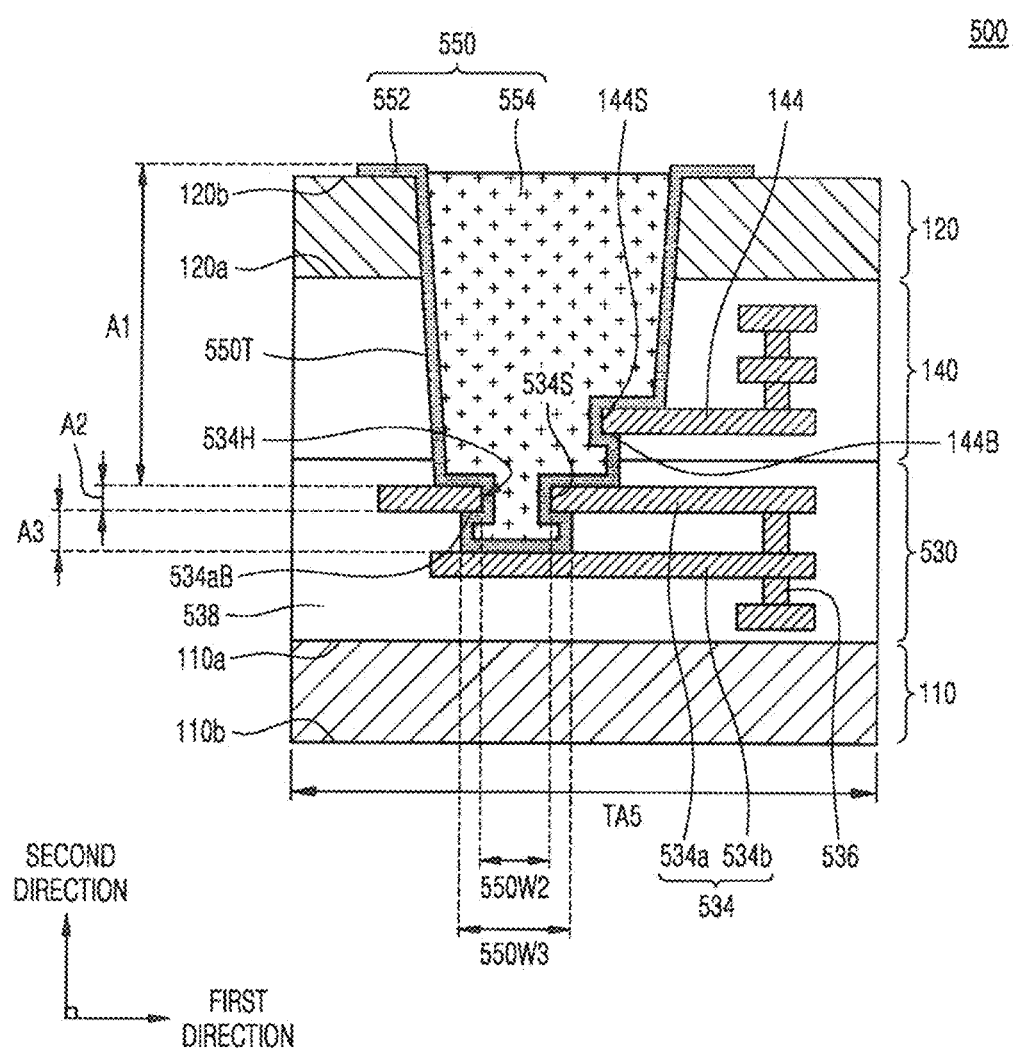
FIG. 5 is a cross-sectional view of a TSV area of an image sensor according to an example embodiment of the inventive concepts.

FIG. 5 is a cross-sectional view of a TSV area TA5 of an image sensor 500 according to an example embodiment of the inventive concepts.

In FIG. 5, the same reference numerals are used to denote the same elements as in FIGS. 1A to 1C, and repeated descriptions thereof are omitted for brevity.

Referring to FIG. 5, in a TSV area TA5, the image sensor 500 may include first and second substrates 110 and 120, a first interlayer insulating layer structure 530, and a second interlayer insulating layer structure 140. The first interlayer insulating layer structure 530 and the second interlayer insulating layer structure 140 may be bonded to each other such that first surfaces 110a and 120a of the the first and second substrates 110 and 120 face each other. Also, the image sensor 500 may include a TSV structure 550 configured to penetrate the second substrate 120 and the second interlayer insulating layer structure 140.

The image sensor 500 may have a similar structure to the image sensor 100 described with reference to FIGS. 1A to 1C except for structures of first conductive pad layers 534 of the first interlayer insulating layer structure 530 and a structure of the TSV structure 550.

The first interlayer insulating layer structure 530 may include first conductive pad layers 534, first contact plugs 536, and a first interlayer insulating layer 538.

The TSV structure 550 may include a TSV conductive layer 552 and a charged layer 554. The TSV conductive layer 552 and the charged layer 554 may include substantially the same materials as the TSV conductive layer 152 and the charged layer 154, respectively, which are described with reference to FIGS. 1A and 1B.

The TSV structure 550 may be in contact with a plurality of first conductive pad layers 534 of the first interlayer insulating layer structure 530 and a second conductive pad layer 144 of the second interlayer insulating layer structure 140. Specifically, the TSV structure 550 may be connected to each of upper and lower first conductive pad layers 534a and 534b, which are formed in the first interlayer insulating layer structure 530, spaced apart from one another, and located at different levels in the first interlayer insulating layer structure 530.

To this end, the upper first conductive pad layer 534a disposed at an uppermost level of the first conductive pad layers 534 may include at least one through hole 534H. That is, the TSV structure 550 may be in contact with the lower first conductive pad layer 534b via the through hole 534H, and the lower first conductive pad layer 534b may be at a lower level than the upper first conductive pad layer 534a.

In some embodiments, the TSV structure 550 may be in contact with a sidewall 144S of the second conductive pad layer 144 and a sidewall 534S of the upper first conductive pad layer 534a exposed by the through hole 534H.

The TSV structure 550 may include a first area A1, a second area A2, and a third area A3. Based on the through hole 534H, the first area A1 may be located over the through hole 534H, the second area A2 may be located within the through hole 534H, and the third area A3 may be located below the through hole 534H.

In some embodiments, a width 550W2 of the TSV structure 550 in the second area A2 in a first direction parallel to the first surface 110a of the first substrate 110 may be less than a width 550W3 of the TSV structure 550 in the third area A3.

That is, the TSV structure 550 may have an inverted T shape in the second area A2 and the third area A3.

Thus, the TSV structure 550 according to the present embodiment may be in contact with a surface of the upper first conductive pad layer 534a, which faces the first surface 110a of the first substrate 110, namely, a partial region of a bottom surface 534aB of the upper first conductive pad layer 534a. Similarly, the TSV structure 550 may be in contact with a partial region of a bottom surface 144B of the second conductive pad layer 144.

When the TSV structure 550 is in contact with not only the sidewalls 144S and 534S of the second and upper first conductive pad layers 144 and 534a but also the bottom surfaces 144B and 534aB thereof as described above, bonding areas between the TSV structure 550 and the second and first conductive pad layers 144 and 534 may further increase. Thus, bonding resistances between the TSV structure 550 and the second and first conductive pad layers 144 and 534 may be reduced.

Furthermore, since the TSV structure 550 has an inverted T shape in the second area A2 and the third area A3, structural stability between the TSV structure 550 and the first conductive pad layers 534 may be reinforced, and contact failures between the TSV structure 550 and the first conductive pad layers 534 may be alleviated.

Figure 6:
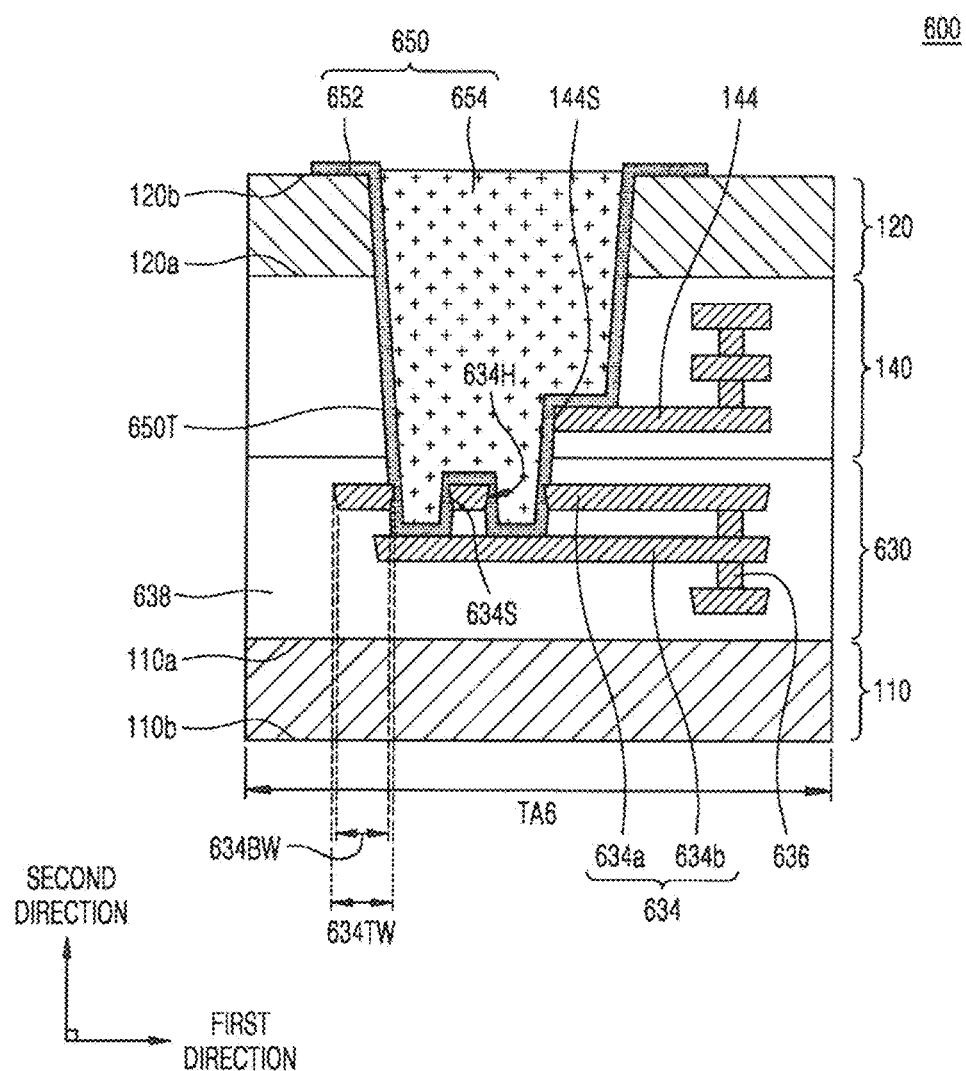
FIG. 6 is a cross-sectional view of a TSV area of an image sensor according to an example embodiment of the inventive concepts.

FIG. 6 is a cross-sectional view of a TSV area TA6 of an image sensor 600 according to an example embodiment of the inventive concepts.

In FIG. 6, the same reference numerals are used to denote the same elements as in FIGS. 1A to 1C, and repeated descriptions thereof are omitted for brevity.

Referring to FIG. 6, in the TSV area TA6, the image sensor 600 may include first and second substrates 110 and 120, a first interlayer insulating layer structure 630, and a second interlayer insulating layer structure 140. The first interlayer insulating layer structure 630 and the second interlayer insulating layer structure 140 may be bonded to each other such that first surfaces 110a and 120a of the first and second substrates 110 and 120 face each other. Also, the image sensor 600 may include a TSV structure 650 configured to penetrate the second substrate 120 and the second interlayer insulating layer structure 140.

The image sensor 600 may have a similar structure to the image sensor 100 described with reference to FIGS. 1A to 1C except for structures of first conductive pad layers 634 of the first interlayer insulating layer structure 630.

The first interlayer insulating layer structure 630 may include first conductive pad layers 634, first contact plugs 636, and a first interlayer insulating layer 638.

The TSV structure 650 may include a TSV conductive layer 652 and a charged layer 654. The TSV conductive layer 652 and the charged layer 654 may include substantially the same materials as the TSV conductive layer 152 and the charged layer 154, respectively, which are described with reference to FIGS. 1A and 1B.

In the present embodiment, an upper width 634TW of the first conductive pad layers 634 in a first direction parallel to the first surface 110a of the first substrate 110 may be greater than a lower width 634BW of each of the first conductive pad layers 634 in the first direction. That is, each of the first conductive pad layers 634 may have a reversed trapezoidal sectional shape.

In some embodiments, the first conductive pad layers 634 having the reversed trapezoidal sectional shape may be the resultant structures obtained by forming the first conductive pad layers 634 by using a damascene process to be described later with reference to FIG. 7D.

Since the first conductive pad layers 634 may have a reversed trapezoidal sectional shape as described above, structural stability between the TSV structure 650 and the first conductive pad layers 634 may be reinforced, and contact failures between the TSV structure 650 and the first conductive pad layers 634 may be alleviated.

FIGS. 7A to 7I are cross-sectional views of sequential process operations of a method of manufacturing image sensors according to example embodiments of the inventive concepts. In FIGS. 7A to 7I, the same reference numerals are used to denote the same elements as in FIGS. 1A to 6, and repeated descriptions thereof are omitted for brevity.

Figure 7A:
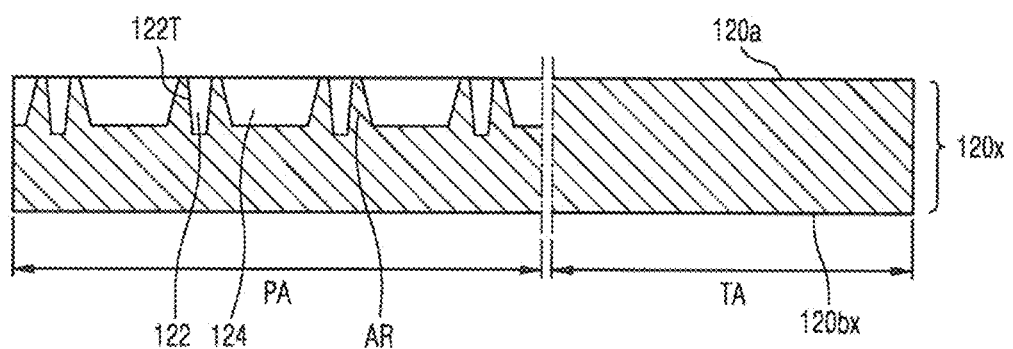
FIGS. 7A to 7I are cross-sectional views of sequential process operations of a method of manufacturing image sensors according to an example embodiment of the inventive concepts.

Referring to FIG. 7A, a pixel area PA and a TSV area TA may be defined, and a flat-panel second substrate 120x having a first surface 120a and a second surface 120bx may be provided. The first surface 120a may correspond to a front surface of the flat-panel second substrate 120x, and the second surface 120bx may correspond to a rear surface of the flat-panel second substrate 120x.

In the pixel area PA, device isolation layers 122 may be formed on the first surface 120a of the second substrate 120x. For example, the formation of the device isolation layers 122 may include forming device isolation trenches 122T by using an STI process and filling the device isolation trenches 122T with an insulating material. A plurality of active regions AR may be defined by the device isolation layers 122.

Photodiodes 124 may be respectively formed in the plurality of active regions AR. In some embodiments, the photodiodes 124 may be formed by an ion implantation process using an ion implantation mask.

Figure 7B:
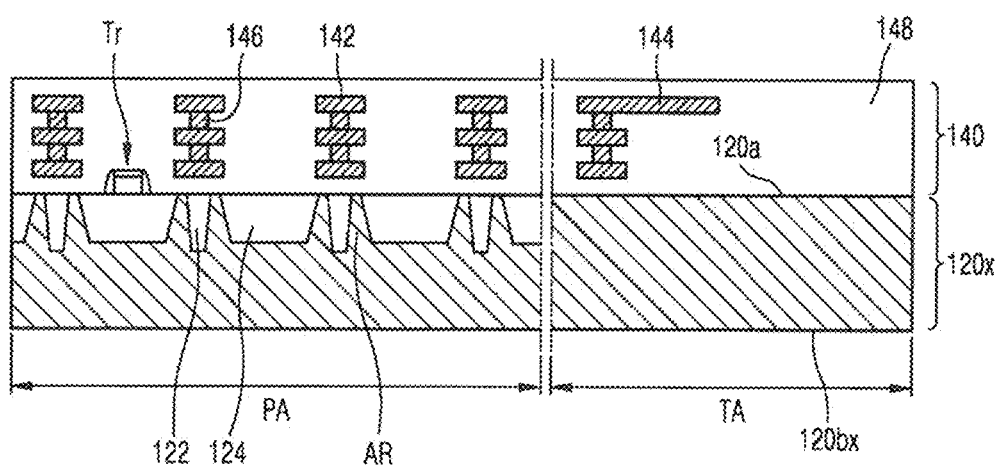

Referring to FIG. 7B, a second interlayer insulating layer structure 140 may be formed on a first surface 120a of the second substrate 120x.

The second interlayer insulating layer structure 140 may include at least one transistor Tr, second interconnection layers 142, a second conductive pad layer 144, second contact plugs 146, and a second interlayer insulating layer 148.

In some embodiments, the formation of the transistor Tr may include forming a gate electrode structure on the first surface 120a of the second substrate 120x and doping impurities into the second substrate 120x located on both sides of the gate electrode structure.

In some embodiments, the transistor Tr may be any one of a transmission transistor, a reset transistor, transit transistor, and a selection transistor, but the inventive concepts are not limited thereto.

As described above with reference to FIG. 1B, the number and arrangement of transistors Tr are not limited to the illustration of FIG. 7B.

In some embodiments, the second interconnection layers 142 and the second conductive pad layer 144, which are formed apart from one another at different levels, may be formed by performing a process of depositing a conductive layer (not shown) and patterning the conductive layer at each level.

In some embodiments, the formation of the second interconnection layers 142 and the second conductive pad layer 144 may include forming a mold pattern (not shown) and filling an opening of the mold pattern with a conductive material by using a damascene process.

The layer numbers and structures of the second interconnection layers 142 and the second conductive pad layer 144 are not limited to the illustration and may be variously modified according to the design of a device.

Figure 7C:
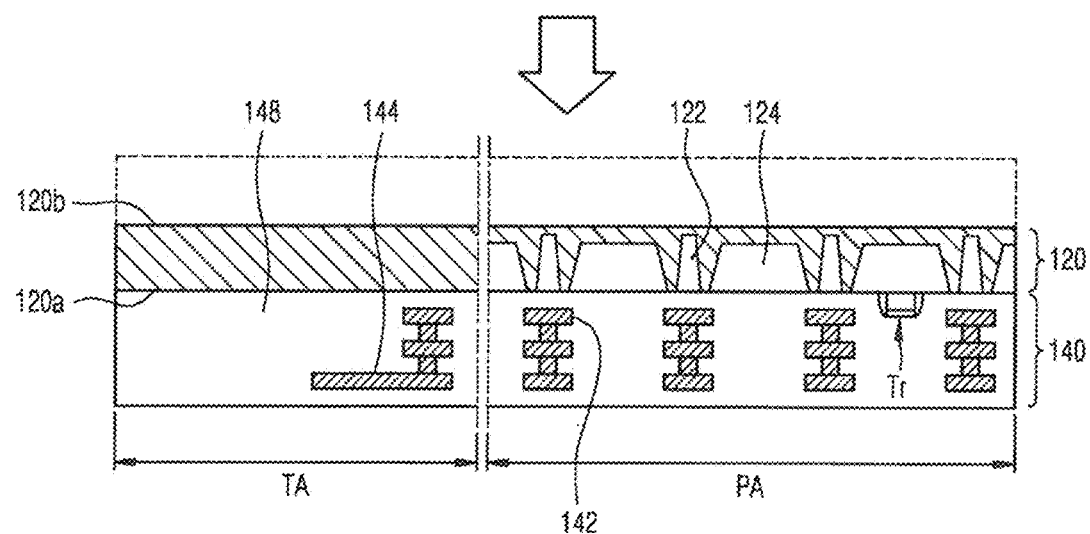

Referring to FIG. 7C, to reduce a thickness of the second substrate (refer to 120x in FIG. 7B), the second surface (refer to 120bx in FIG. 7B) of the second substrate 120x may be ground. A second substrate 120 including the first surface 120a and the second surface 120b may be formed by performing the grinding process. Meanwhile, the order of the grinding process is not limited to the present embodiment. For example, the grinding process may be performed after a bonding process to be described with reference to FIG. 7E.

Figure 7D:
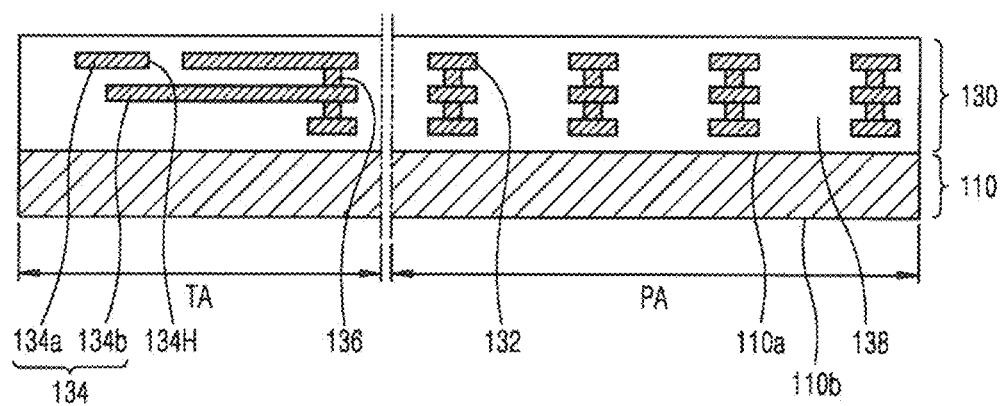

Referring to FIG. 7D, a pixel area PA and a TSV area TA may be defined, and a flat-panel first substrate 110 having a first surface 110a and a second surface 110b may be provided. For example, the first surface 110a may correspond to a front surface of the flat-panel first substrate 110, and the second surface 110b may correspond to a rear surface of the flat-panel first substrate 110.

A first interlayer insulating layer structure 130 may be formed on the first surface 110a. The second interlayer insulating layer structure 130 may include a first interconnection layers 132, first conductive pad layers 134, first contact plugs 136, and a first interlayer insulating layer 138.

In some embodiments, the first interconnection layers 132 and the first conductive pad layers 134 may be formed by performing a process of depositing a conductive layer (not shown) and patterning the conductive layer at each level.

In some other embodiments, formation of the first interconnection layers 132 and the first conductive pad layers 134 may include forming a mold pattern (not shown) and filling an opening of the mold pattern with a conductive material by using a damascene process.

When the first interconnection layers 132 and the first conductive pad layers 134 are formed by using a damascene process as described above, the first interconnection layers 132 and the first conductive pad layers 134 may have a reversed trapezoidal sectional shape similar to the first conductive pad layers 634 described with reference to FIG. 6.

At least one through hole 134H may be formed in at least one first conductive pad layer 134a among the first conductive pad layers 134.

Layer numbers and structures of the first interconnection layers 132 and the first conductive pad layers 134 are not limited to the illustration and may be variously modified according to the design of a device.

Figure 7E:
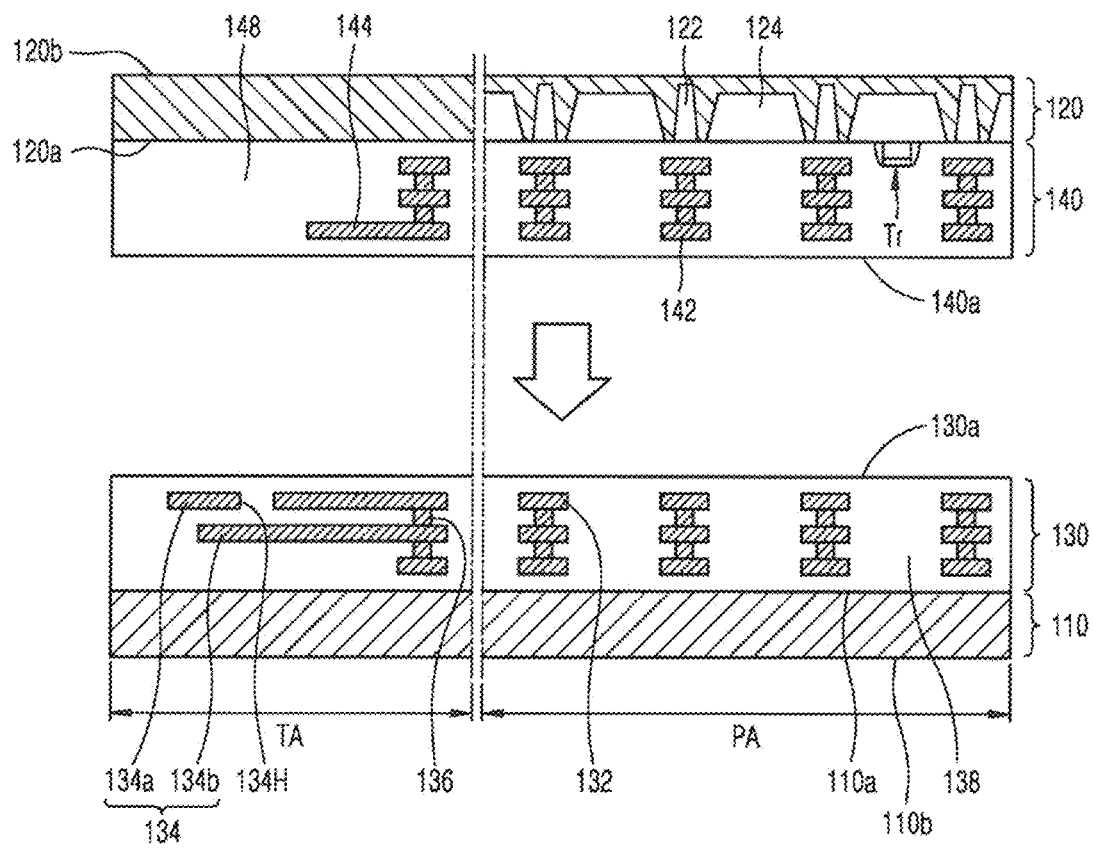

Referring to FIG. 7E a first surface 130a of the first interlayer insulating layer structure 130 may be bonded to a first surface 140a of the second interlayer insulating layer structure 140 such that the first surface 110a of the first substrate 110 faces the first surface 120a of the second substrate 120.

In some embodiments, the first interlayer insulating layer structure 130 and the second interlayer insulating layer structure 140 may be bonded to each other by at least one of a heating process, a pressure application process, and a plasma processing process.

Figure 7F:
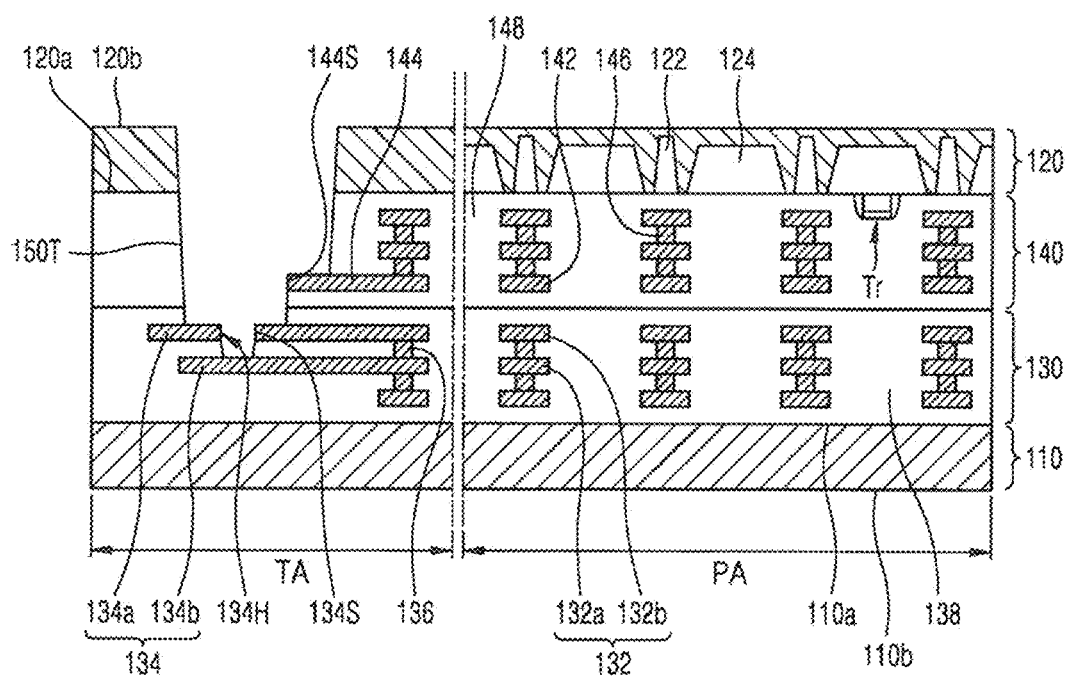

Referring to FIG. 7F, in the TSV area TA, a TSV trench 150T may be formed by using an etching process to expose partial regions of the first conductive pad layers 134 and the second conductive pad layer 144.

In some embodiments, the etching process may be performed using an anisotropic etching process. In an example, the anisotropic etching process may be any one of a physical etching process (e.g., a sputter etching process), a chemical etching process (e.g., a reactive radical etching process), and a physiochemical etching process (e.g., a reactive ion etching (RIE) process, a magnetically enhanced RIE (MERIE) process, a transformer coupled plasma (TCP) etching process, and an inductively coupled plasma (ICP) etching process, but the inventive concepts are not limited thereto.

Although not shown, during the etching process, a mask pattern (not shown) may be formed on the second surface 120b of the second substrate 120 to expose a region in which the TSV trench 150T will be formed and cover the remaining region.

During the etching process, the first conductive pad layers 134 and the second conductive pad layer 144 may serve as an etch stop layer.

FIG. 7F illustrates an embodiment in which the first conductive pad layers 134 and the second conductive pad layer 144 are not etched by the etching process at all, but the inventive concepts are not limited thereto. That is, the first conductive pad layers 134 and the second conductive pad layer 144 may be partially removed due to the etching process.

After the etching process is finished, a cleaning process may be additionally performed to remove residue that may occur due to the etching process.

Since the upper first conductive pad layer 134a according to the present embodiment may include at least one through hole 134H, the TSV trench 150T may extend to the lower first conductive pad layer 134b via the through hole 134H.

Figure 7G:
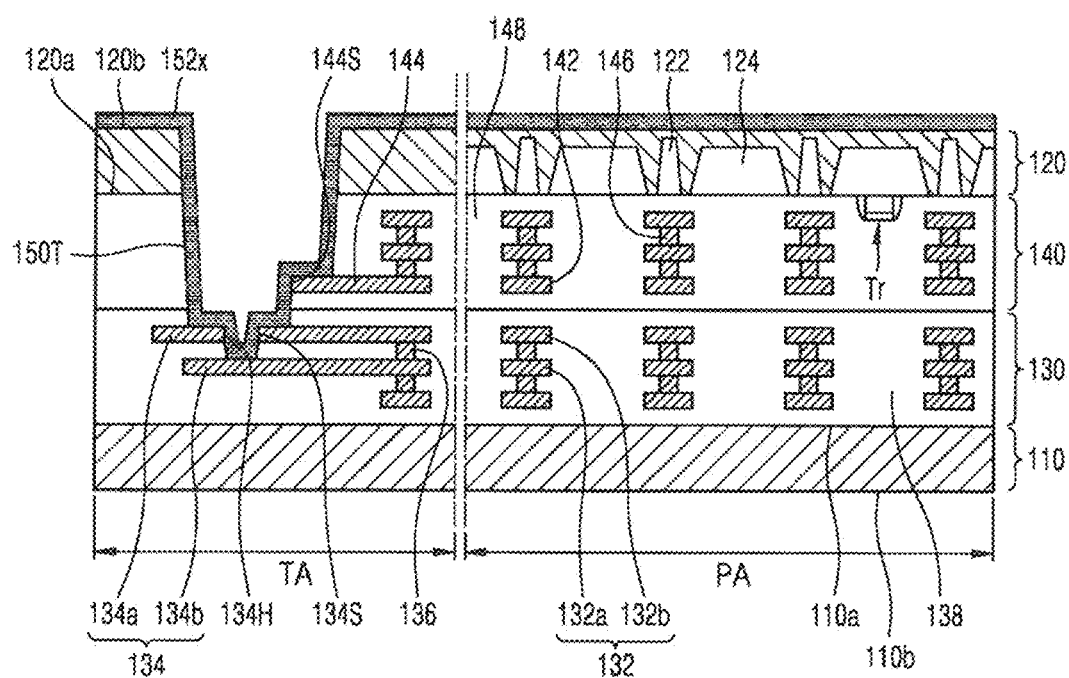

Referring to FIG. 7G, a TSV conductive layer 152x may be formed to cover the second surface 120b of the second substrate 120 and the TSV trench 150T. The TSV conductive layer 152x may include, for example, W, Al or a combination thereof.

In some embodiments, the TSV conductive layer 152x may be formed by using a chemical vapor deposition (CVD) process, a metal organic CVD (MOCVD) process, an atomic layer deposition (ALD) process, or a metal organic ALD (MOALD) process, but the inventive concepts are not limited thereto.

In the present embodiment, the TSV conductive layer 152x may be formed over the entire TSV area TA and pixel area PA. However, in another case, the TSV conductive layer 152x may be formed only in the TSV area TA.

Figure 7H:
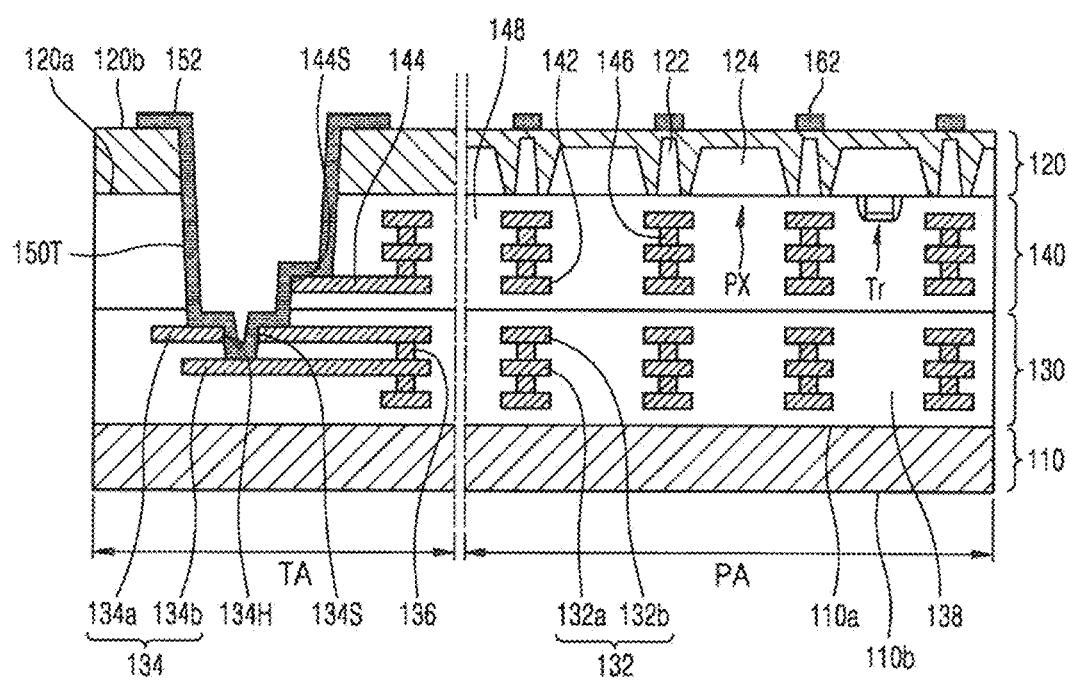

Referring to FIG. 7H, the TSV conductive layer 152x may be patterned to form a TSV conductive layer 152 on the TSV area TA and form a node separation pattern 162 on the pixel area PA.

Figure 7I:
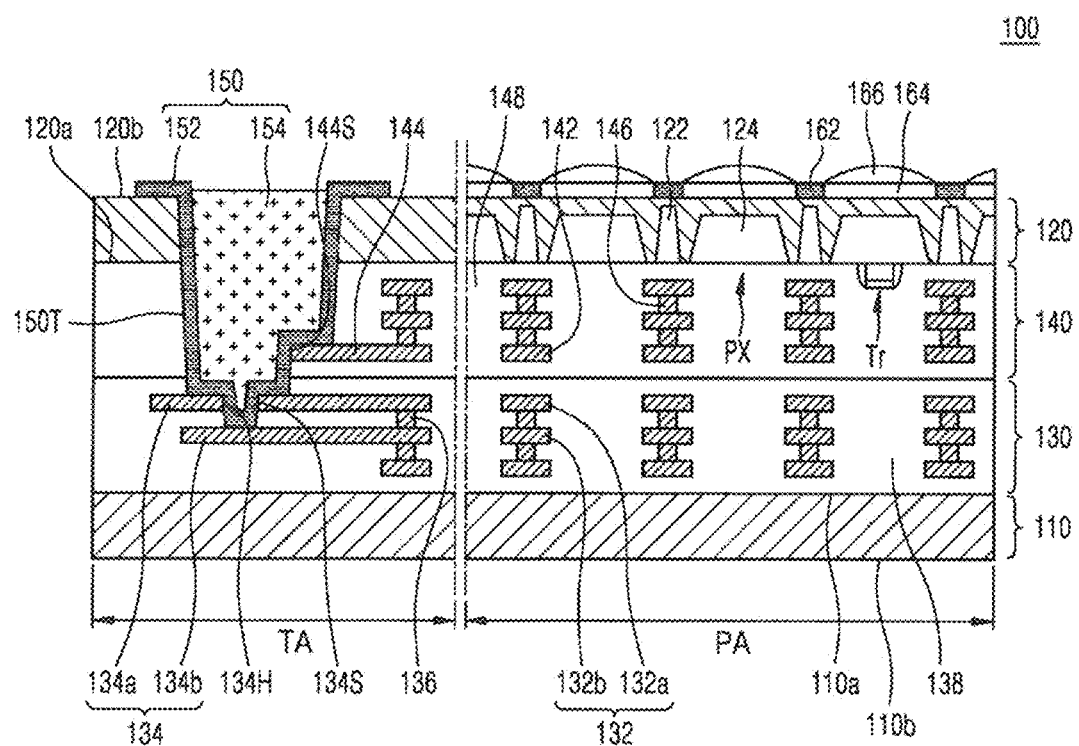

Referring to FIG. 7I, in the TSV area TA, a charged layer 154 may be formed to fill the TSV trench 150T, which may remain after the TSV conductive layer 152 is formed. In the pixel area PA, color filters 164 and microlenses 166 may be formed to overlap the respective unit pixels PX, thereby completing the formation of an image sensor 100.

FIGS. 8A to 8E are cross-sectional views of sequential process operations of a method of manufacturing image sensors according to an example embodiment of the inventive concepts. In FIGS. 8A to 8E, the same reference numerals are used to denote the same elements as in FIGS. 1A to 7I, and repeated descriptions thereof are omitted for brevity.

Figure 8A:
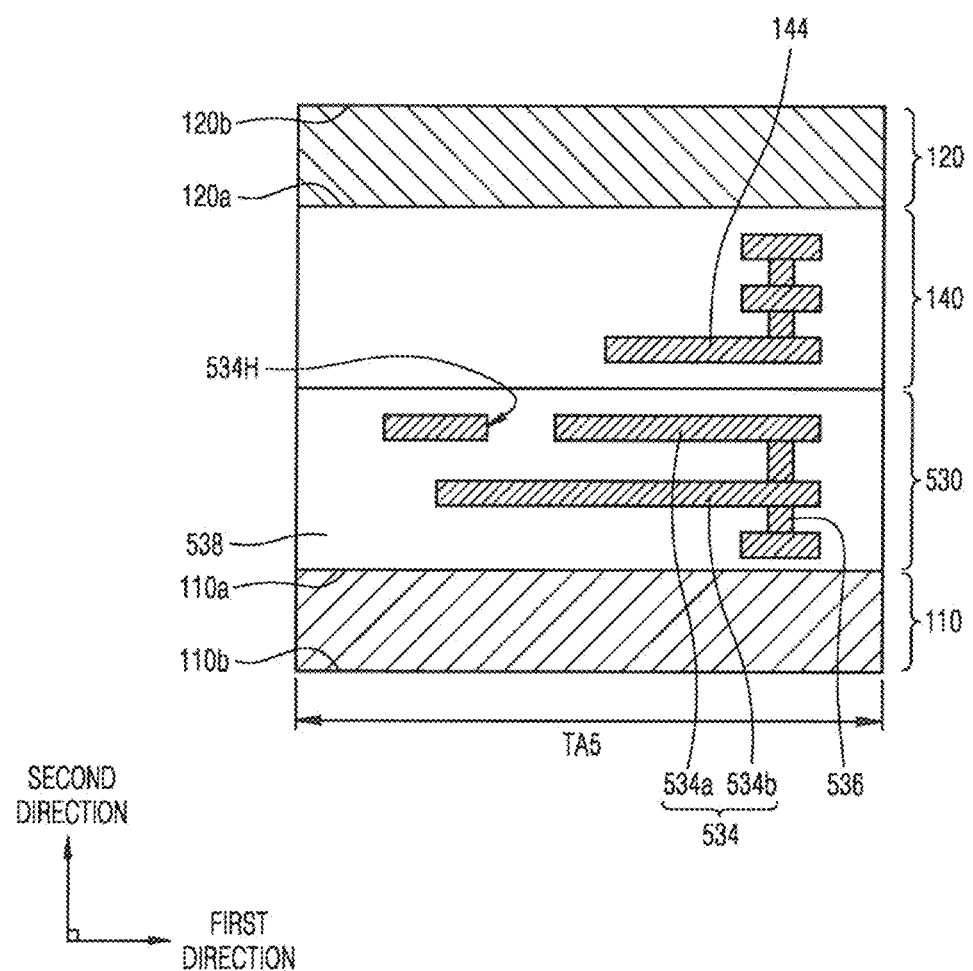
FIGS. 8A to 8E are cross-sectional views of sequential process operations of a method of manufacturing image sensors according to an example embodiment of the inventive concepts.

Referring to FIG. 8A, in a TSV area TA5, a stack structure may be prepared by sequentially stacking a first substrate 110, a first interlayer insulating layer structure 530, a second interlayer insulating layer structure 140, and a second substrate 120. A process of forming the stack structure may be substantially the same as processes described with reference to FIGS. 7A to 7E.

Figure 8B:
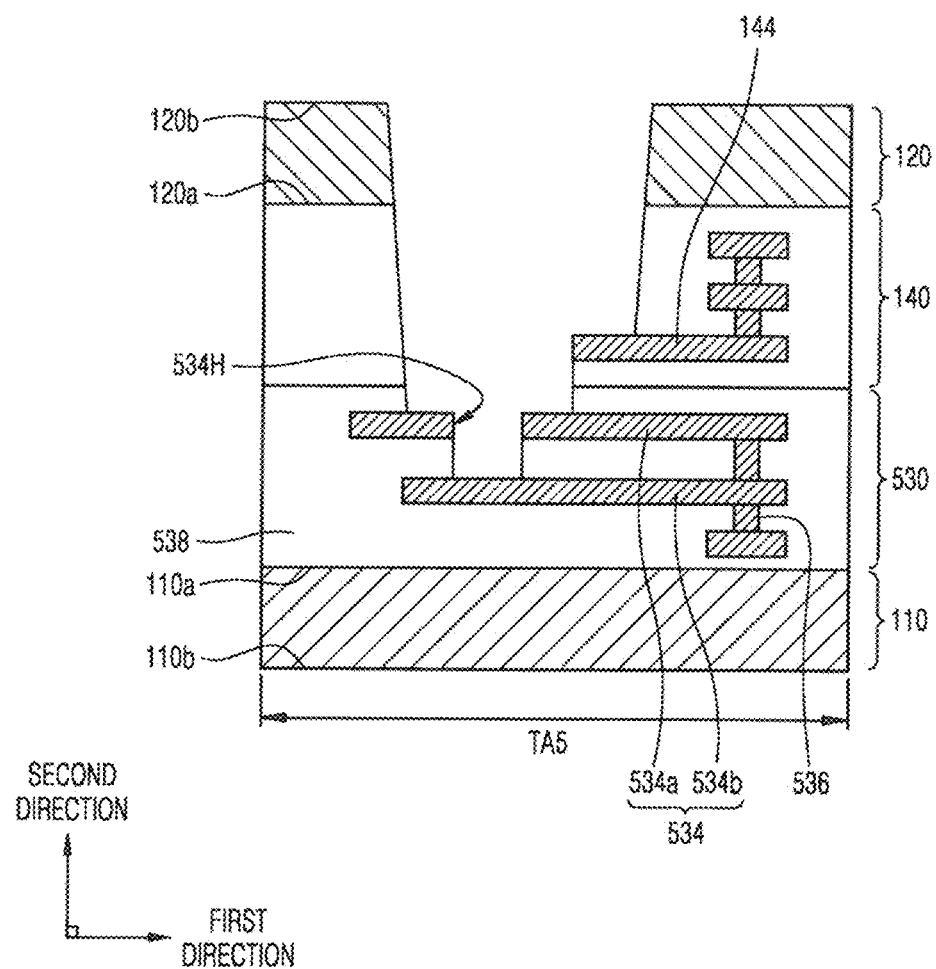

Referring to FIG. 8B, in the TSV area TA5, a TSV trench 550T may be formed by using an etching process to expose partial regions of first conductive pad layers 534 and a second conductive pad layer 144. A process of forming the TSV trench 550T may be substantially the same as the process of forming the TSV trench 150T as described with reference to FIG. 7F.

Figure 8C:
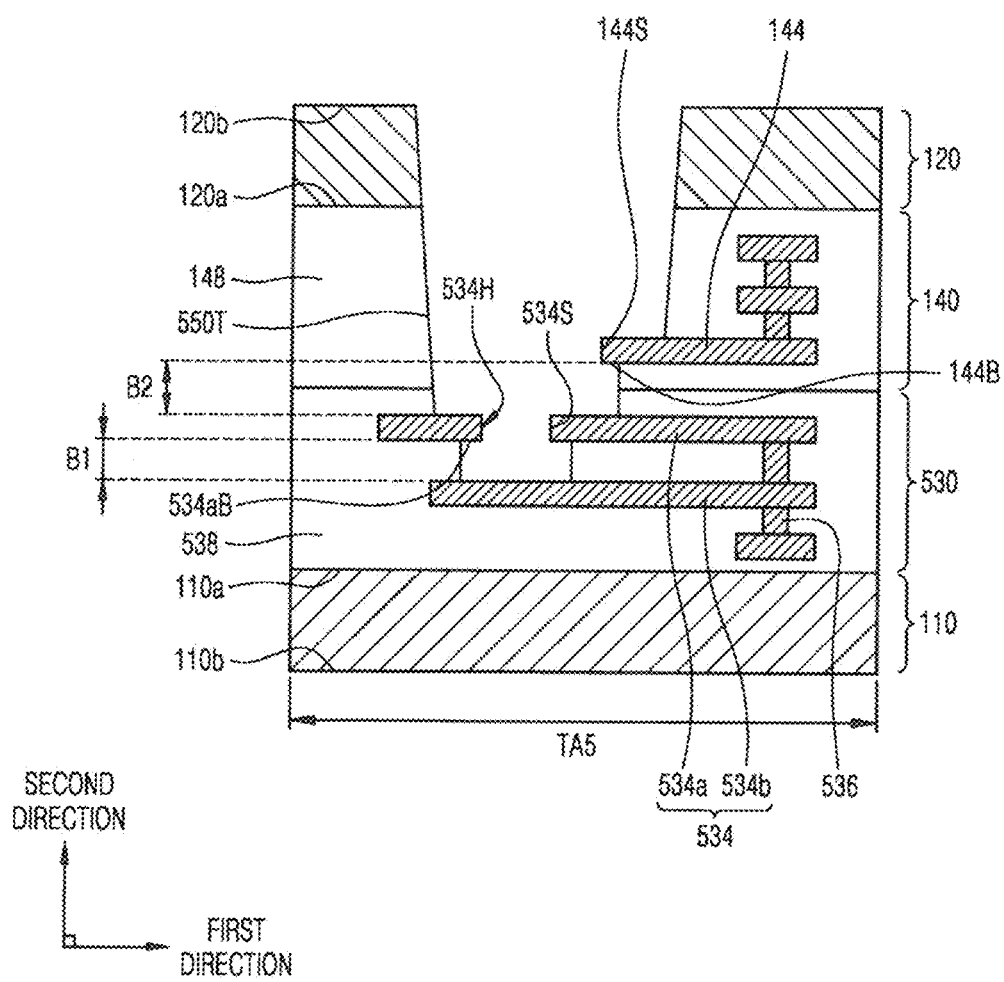

Referring to FIG. 8C, a stripping process may be performed within the TSV trench 550T. Due to the stripping process, a partial region of a first interlayer insulating layer 538 located in an area B1 between an upper first conductive pad layer 534a and a lower first conductive pad layer 534b and partial regions of first and second interlayer insulating layers 538 and 148 located in an area B2 between the upper first conductive pad layer 534a and the second conductive pad layer 144 may be removed in a first direction parallel to the first surface 110a of the first substrate 110. Thus, a partial region of a bottom surface 534aB of the upper first conductive pad layer 534a and/or a partial region of a bottom surface 144B of the second conductive pad layer 144 may be exposed due to the stripping process.

Figure 8D:
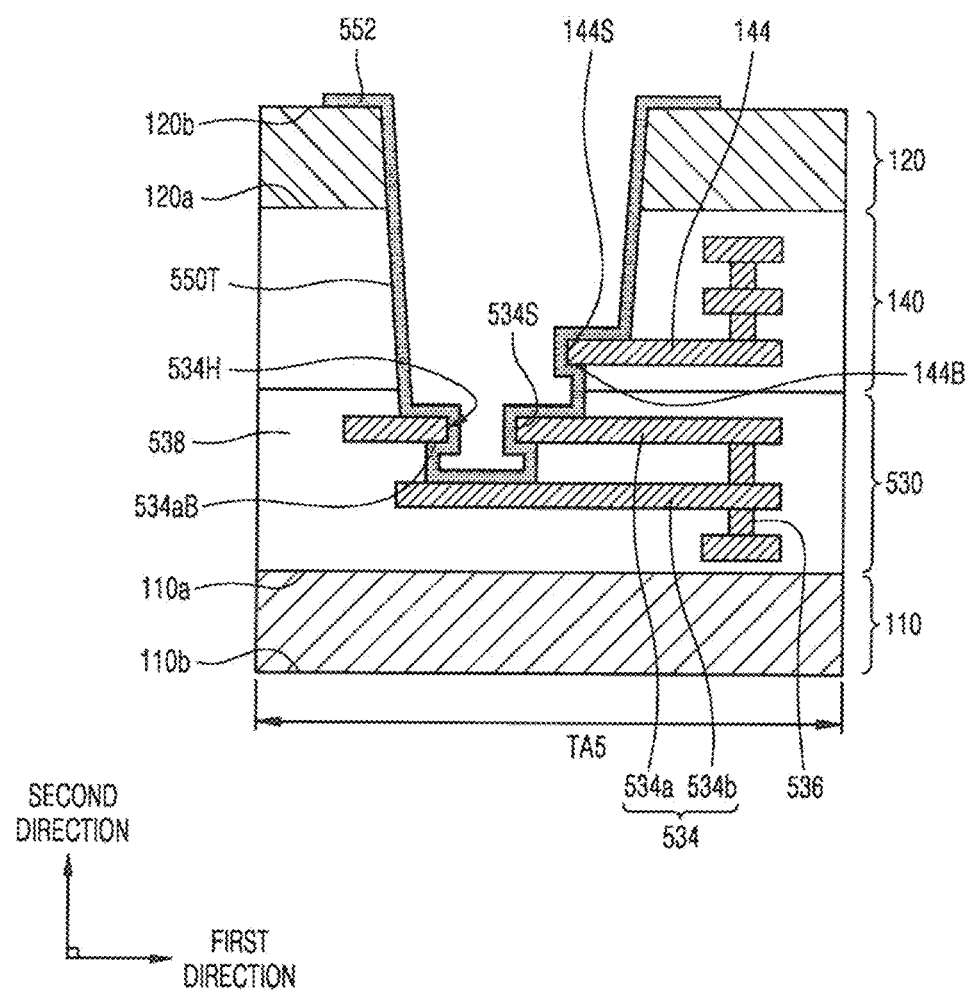

Referring to FIG. 8D, a TSV conductive layer 552 may be formed to cover the TSV trench 550T. A process of forming the TSV conductive layer 552 may be similar to the process of forming the TSV conductive layer 152 as described with reference to FIGS. 7G and 7H.

In the present embodiment, since the TSV trench 550T may expose the partial regions of the bottom surfaces 144B and 534aB of the second and upper first conductive pad layers 144 and 534a, the TSV conductive layer 552 may be in contact with not only sidewalls 144S and 534S of the second and upper first conductive pad layers 144 and 534a but also the partial regions of the bottom surfaces of 144B and 534aB thereof.

Figure 8E:
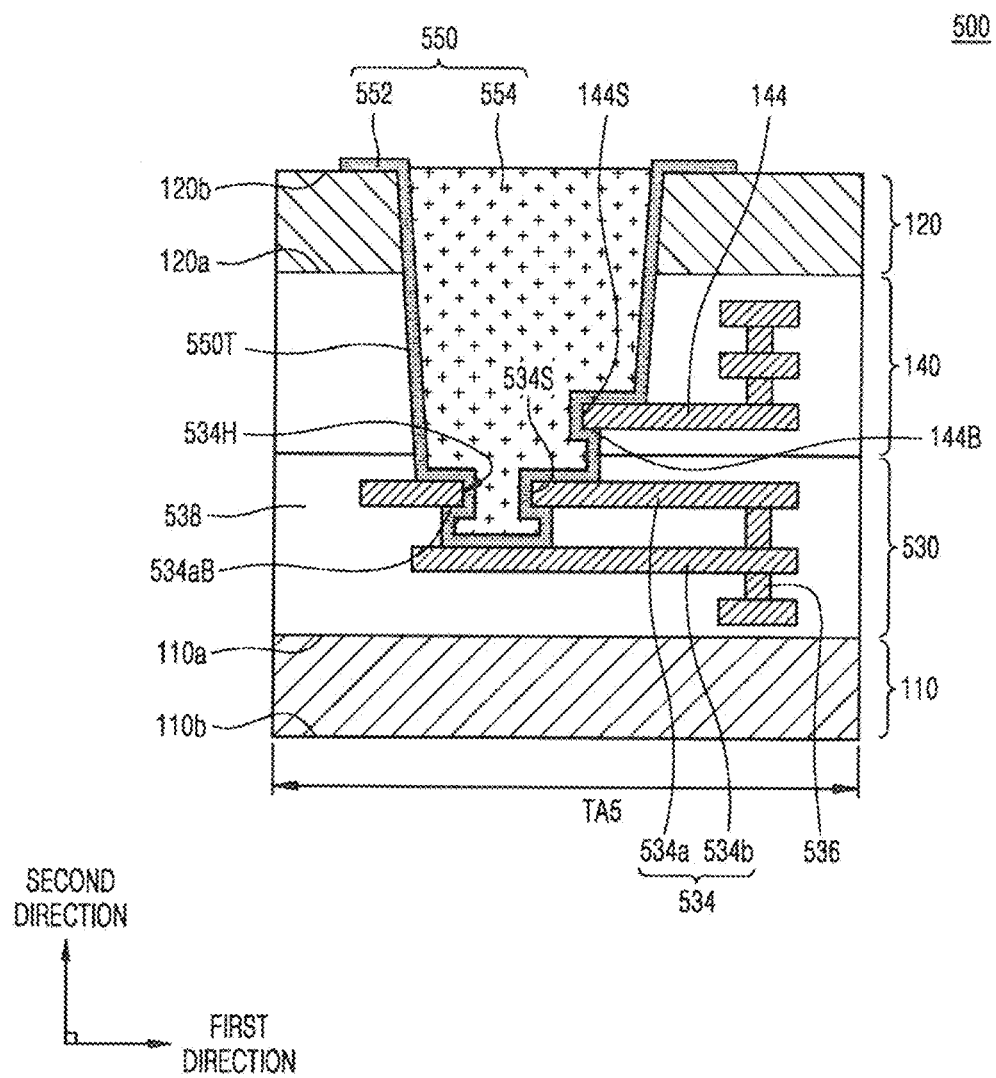

Referring to FIG. 8E, a charged layer 554 may be formed to fill the TSV trench 550T, which may remain after the TSV conductive layer 552 is formed, thereby completing the formation of an image sensor 500.

Figure 9:
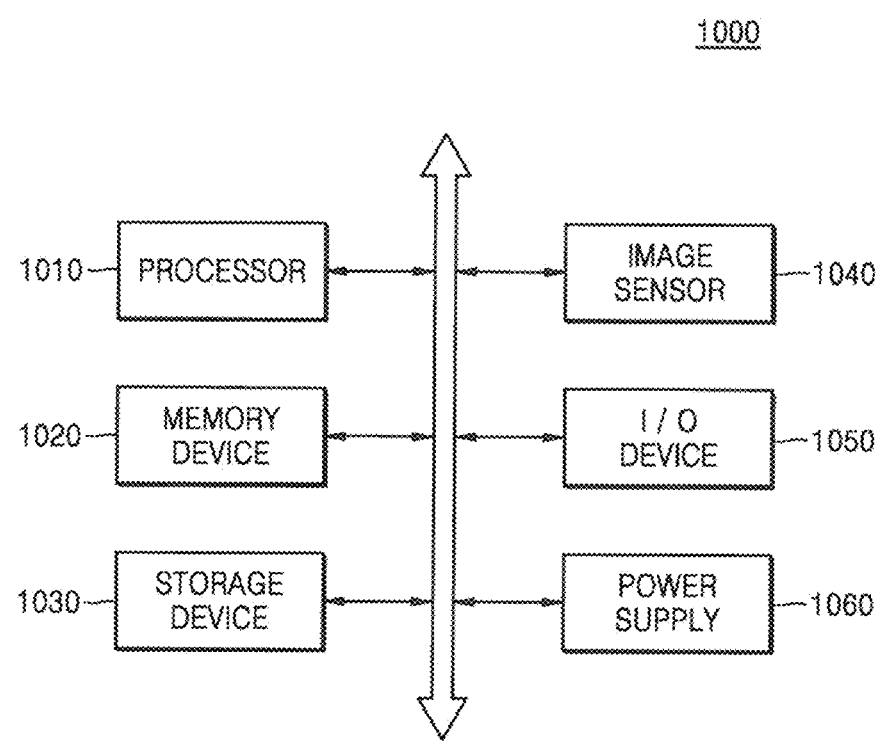
FIG. 9 is a block diagram of an electronic system including image sensors according to an example embodiment of the inventive concepts.

FIG. 9 is a block diagram of an electronic system 1000 including image sensors according to an example embodiment of the inventive concepts.

Referring to FIG. 9, the electronic system 1000 may include a processor 1010, a memory device 1020, a storage device 1030, an image sensor 1040, an input/device (I/O) device 1050, and a power supply device 1060. Although not shown, the electronic system 1000 may further include ports capable of communicating with a video card, a sound card, a memory card, or a universal serial bus (USB) device and/or communicating with other electronic systems.

The processor 1010 may perform specific calculations or tasks. For example, the processor 1010 may be a microprocessor (MP) or a central processing unit (CPU). The processor 1010 may be connected to and communicate with the memory device 1020, the storage device 1030, and/or the I/O device 1050 via an address bus, a control bus, and a data bus. In an example embodiment of the inventive concepts, the processor 1010 may be connected to an expansion bus, such as a peripheral component interconnect (PCI) bus.

The memory device 1020 may store data required for an operation of the electronic system 1000.

The storage device 1030 may include, for example, a solid-state drive (SSD), a hard disk drive (HDD), and/or a compact disk read-only memory (CD-ROM). The I/O device 1050 may include, for example, an input unit, such as a keyboard, a keypad, and/or a mouse, and an output unit, such as a printer and/or a display. The power supply device 1060 may supply an operating voltage required for operations of the electronic system 1000.

The image sensor 1040 may be connected to and communicate with the processor 1010 via the buses and/or other communication links. The image sensor 1040 may be substantially the same as any one of the image sensors 100, 200, 300, 400, 500, and 600 described with reference to FIGS. 1A to 6.

In some embodiments, the image sensor 1040 may be integrated along with the processor 1010 in a single chip or the image sensor 1040 and the processor 1010 may be integrated in respectively different chips.

While the inventive concepts have been particularly shown and described with reference to example embodiments thereof, it will be understood that various changes in form and details may be made therein without departing from the spirit and scope of the following claims.

What is claimed is:

1. An integrated circuit (IC) device comprising:
a first substrate;
a first structure on a front surface of the first substrate, the first structure comprising a first interlayer insulating layer structure comprising a plurality of first conductive pad layers spaced apart from one another and located at different levels of the first interlayer insulating layer structure;
a second substrate on the first substrate;
a second structure on a front surface of the second substrate, which faces the front surface of the first substrate, the second structure comprising a second interlayer insulating layer structure bonded to the first interlayer insulating layer structure; and
a through-silicon via (TSV) structure configured to penetrate the second substrate and the second interlayer insulating layer structure, the TSV structure being in contact with at least two first conductive pad layers of the plurality of first conductive pad layers located at different levels of the first interlayer insulating layer structure, wherein the TSV structure is in physical and electrical contact with, and extends along, a sidewall of at least one of the at least two first conductive pad layers,
wherein the at least two first conductive pad layers comprise an upper first conductive pad layer and a lower first conductive pad layer at a lower level than the upper first conductive pad layer, and
wherein a portion of the TSV structure is interposed between the upper first conductive pad layer and the lower first conductive pad layer, and the portion of the TSV structure directly contacts a bottom surface of the upper first conductive pad layer and a top surface of the lower first conductive pad layer, the bottom surface of the upper first conductive pad layer facing the top surface of the lower first conductive pad layer.

2. The IC device of claim 1, wherein the second interlayer insulating layer structure comprises a second conductive pad layer, and
the TSV structure is in contact with the second conductive pad layer.

3. The IC device of claim 2, wherein the TSV structure is in contact with, and extends along, a sidewall of the second conductive pad layer.

4. The IC device of claim 1, wherein the upper first conductive pad layer comprises a through hole, and the TSV structure is in physical and electrical contact with the lower first conductive pad layer through the through hole.

5. The IC device of claim 4, wherein the upper first conductive pad layer is an uppermost layer among the plurality of first conductive pad layers.

6. The IC device of claim 4, wherein the bottom surface of the upper first conductive pad layer faces the front surface of the first substrate.

7. The IC device of claim 4, wherein the TSV structure comprises a first region located above the through hole, a second region located in the through hole, and a third region located below the through hole, and
a width of the second region in a first direction parallel to the front surface of the first substrate is less than a width of the third region in the first direction.

8. The IC device of claim 7, wherein the TSV structure has an inverted T shape in the second and third regions.

9. The IC device of claim 1, wherein the upper first conductive pad layer comprises a first through hole,
wherein the plurality of first conductive pad layers further comprise a middle first conductive pad layer located between the upper first conductive pad layer and the lower first conductive pad layer, the middle first conductive pad layer comprising a second through hole,
wherein the TSV structure is in contact with the lower first conductive pad layer through the first and second through holes.

10. The IC device of claim 9, wherein a width of the first through hole in a first direction parallel to the front surface of the first substrate is greater than a width of the second through hole in the first direction.

11. An integrated circuit (IC) device comprising:
a first substrate comprising a first through-silicon via (TSV) area and a first area;
a first interlayer insulating layer structure on a front surface of the first substrate, the first interlayer insulating layer structure comprising a plurality of first conductive pad layers which are formed in the first TSV area, spaced apart from one another, and located at different levels in the first interlayer insulating layer structure;
a second substrate on the first substrate comprising a second TSV area and a second area, the second substrate comprising a plurality of photodiodes in the second area;
a second interlayer insulating layer structure on a front surface of the second substrate, which faces the front surface of the first substrate, and bonded to the first interlayer insulating layer structure; and
a TSV structure configured to penetrate the second substrate and the second interlayer insulating layer structure, the TSV structure being in contact with at least two first conductive pad layers, which are located at different levels among the plurality of first conductive pad layers, in the first TSV area,
wherein the TSV structure is in physical and electrical contact with, and extends along, a sidewall of at least one of the at least two first conductive pad layers,
wherein the at least two first conductive pad layers comprise an upper first conductive pad layer and a lower first conductive pad layer at a lower level than the upper first conductive pad layer, and
wherein a portion of the TSV structure is interposed between the upper first conductive pad layer and the lower first conductive pad layer, and the portion of the TSV structure directly contacts a bottom surface of the upper first conductive pad layer and a top surface of the lower first conductive pad layer, the bottom surface of the upper first conductive pad layer facing the top surface of the lower first conductive pad layer.

12. The IC device of claim 11, wherein the first interlayer insulating layer structure comprises a plurality of first interconnection layers in the first area, the first interconnection layers being spaced apart from one another and located at different levels in the first interlayer insulating layer structure, and
wherein respective ones of the plurality of first conductive pad layers in the first TSV area are located at a same level as at least one of the first interconnection layers formed in the first area.

13. The IC device of claim 11, wherein at least one of the first conductive pad layers has a reversed trapezoidal sectional shape.

14. The IC device of claim 11, further comprising:
a plurality of color filters on a rear surface of the second substrate, which is opposite the front surface of the second substrate, in the second area; and
microlenses formed on the plurality of color filters, respectively.

15. An integrated circuit (IC) device comprising:
a first substrate;
a first interlayer insulating layer structure on the first substrate comprising a first interlayer insulating layer, a first face, and a second face that is opposite the first face;
a second interlayer insulating layer structure directly on the first interlayer insulating layer structure and comprising a second interlayer insulating layer, a third face that is directly in contact with the second face of the first interlayer insulating layer structure, and a fourth face that is opposite the third face;
an upper first conductive pad layer within the first interlayer insulating layer structure and between the first face and the second face of the first interlayer insulating layer structure;
a lower first conductive pad layer within the first interlayer insulating layer structure and between the upper first conductive pad layer and the first face of the first interlayer insulating layer structure;
a second conductive pad layer within the second interlayer insulating layer structure and between the third face and the fourth face of the second interlayer insulating layer structure;
a second substrate on the second interlayer insulating layer structure; and
a through-silicon via (TSV) structure comprising a conductive layer and configured to penetrate the second substrate, the second interlayer insulating layer structure, and the first interlayer insulating layer structure, the TSV structure contacting the second conductive pad layer, the upper first conductive pad layer, and the lower first conductive pad layer,
wherein the TSV structure is electrically connected to the second conductive pad layer, the upper first conductive pad layer, and the lower first conductive pad layer, and
wherein a portion of the TSV structure is interposed between the upper first conductive pad layer and the lower first conductive pad layer, and the portion of the TSV structure directly contacts a bottom surface of the upper first conductive pad layer and a top surface of the lower first conductive pad layer, the bottom surface of the upper first conductive pad layer facing the top surface of the lower first conductive pad layer.

16. The IC device of claim 15, wherein a top surface of the upper first conductive pad layer is between the second face and the first face, and the bottom surface of the upper first conductive pad layer is between the top surface of the upper first conductive pad layer and the first face, wherein the top surface of the lower first conductive pad layer is between the bottom surface of the upper first conductive pad layer and the first face, and a bottom surface of the lower first conductive pad layer is between the top surface of the lower first conductive pad layer and the first face, wherein a top surface of the second conductive pad layer is between the third face and the fourth face, and a bottom surface of the second conductive pad layer is between the top surface of the second conductive pad layer and the third face, and wherein the TSV structure contacts the top surface of the upper first conductive pad layer and the top surface of the second conductive pad layer.

17. The IC device of claim 16, wherein the TSV structure extends through a hole in the upper first conductive pad layer to physically and electrically contact the top surface of the lower first conductive pad layer.

18. The IC device of claim 17, wherein the TSV structure physically and electrically contacts the bottom surface of the second conductive pad layer.

19. The IC device of claim 17, further comprising an additional first conductive pad layer within the first interlayer insulating layer structure between the upper first conductive pad layer and the second face, wherein the hole in the upper first conductive pad layer is a first hole, and wherein the TSV structure extends through a second hole in the additional first conductive pad layer to contact the top surface of the lower first conductive pad layer.

20. The IC device of claim 15, wherein the TSV structure is in physical and electrical contact with, and extends along, a sidewall of the upper first conductive pad layer.

\* \* \* \* \*